United States Patent
Takemura

(10) Patent No.: US 9,105,351 B2
(45) Date of Patent: Aug. 11, 2015

(54) SEMICONDUCTOR MEMORY DEVICE INCLUDING AMPLIFIER CIRCUIT

(71) Applicant: Semiconductor Energy Laboratory Co., Ltd., Atsugi-shi, Kanagawa-ken (JP)

(72) Inventor: Yasuhiko Takemura, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 141 days.

(21) Appl. No.: 13/671,590

(22) Filed: Nov. 8, 2012

(65) Prior Publication Data

US 2013/0114330 A1 May 9, 2013

(30) Foreign Application Priority Data

Nov. 9, 2011 (JP) ................................. 2011-245512

(51) Int. Cl.
*G11C 11/24* (2006.01)
*G11C 11/4074* (2006.01)
*G11C 11/4094* (2006.01)
*G11C 11/4097* (2006.01)

(52) U.S. Cl.
CPC ........ *G11C 11/4074* (2013.01); *G11C 11/4094* (2013.01); *G11C 11/4097* (2013.01)

(58) Field of Classification Search
USPC ....................... 365/149, 203, 205, 207, 230.03
See application file for complete search history.

(56) References Cited

U.S. PATENT DOCUMENTS

| | | | | |
|---|---|---|---|---|
| 5,353,255 A | * | 10/1994 | Komuro | 365/208 |
| 5,495,440 A | | 2/1996 | Asakura | |
| 5,764,562 A | * | 6/1998 | Hamamoto | 365/149 |
| 6,066,871 A | * | 5/2000 | Ema | 257/306 |
| 6,160,753 A | * | 12/2000 | Shibayama | 365/230.06 |
| 6,469,941 B2 | * | 10/2002 | Ricodeau | 365/189.09 |
| 7,772,053 B2 | | 8/2010 | Kameshiro et al. | |
| 7,924,599 B1 | * | 4/2011 | Evans et al. | 365/145 |
| 2003/0002319 A1 | * | 1/2003 | Ricodeau | 365/149 |
| 2006/0193168 A1 | * | 8/2006 | Schroder et al. | 365/185.01 |
| 2007/0070759 A1 | * | 3/2007 | Leung | 365/208 |
| 2008/0278991 A1 | * | 11/2008 | Kajigaya | 365/149 |
| 2008/0283816 A1 | * | 11/2008 | Takaishi | 257/4 |
| 2009/0244954 A1 | * | 10/2009 | Cannon et al. | 365/149 |
| 2010/0254179 A1 | * | 10/2010 | Kim | 365/149 |

(Continued)

OTHER PUBLICATIONS

Kiyoshi Takeuchi et al.; "Channel Engineering for the Reduction of Random-Dopant-Placement-Induced Threshold Voltage Fluctuation"; IEDM 97: Technical Digest of International Electron Devices Meeting; Dec. 7, 1997; pp. 841-844.

*Primary Examiner* — Hoai V Ho
(74) *Attorney, Agent, or Firm* — Fish & Richardson P.C.

(57) ABSTRACT

In a conventional DRAM, a decrease in the capacitance of a capacitor causes an error in reading data. A plurality of memory blocks MB is connected to one bit line BL_m. Each memory block MB includes a sub bit line SBL, a plurality of memory cells, and a precharge transistor. The drain of a transistor of the memory cell is connected one of the bit line BL_m and the sub bit line SBL, whereas a capacitor of the memory cell is connected to the other one of the bit line BL_m and the sub bit line SBL. The capacitance of the sub bit line SBL is sufficiently low; thus, a potential change due to electric charges of the capacitor of the memory cell can be amplified by an amplifier circuit AMP without an error and the amplified signal can be output to the bit line.

17 Claims, 22 Drawing Sheets

(56) References Cited

U.S. PATENT DOCUMENTS

| | | |
|---|---|---|
| 2011/0156027 A1 | 6/2011 | Yamazaki et al. |
| 2012/0075917 A1 | 3/2012 | Takemura |
| 2012/0081948 A1 | 4/2012 | Takemura |
| 2012/0195104 A1 | 8/2012 | Takemura |
| 2013/0100723 A1 | 4/2013 | Takemura |
| 2013/0100748 A1 | 4/2013 | Takemura |

* cited by examiner

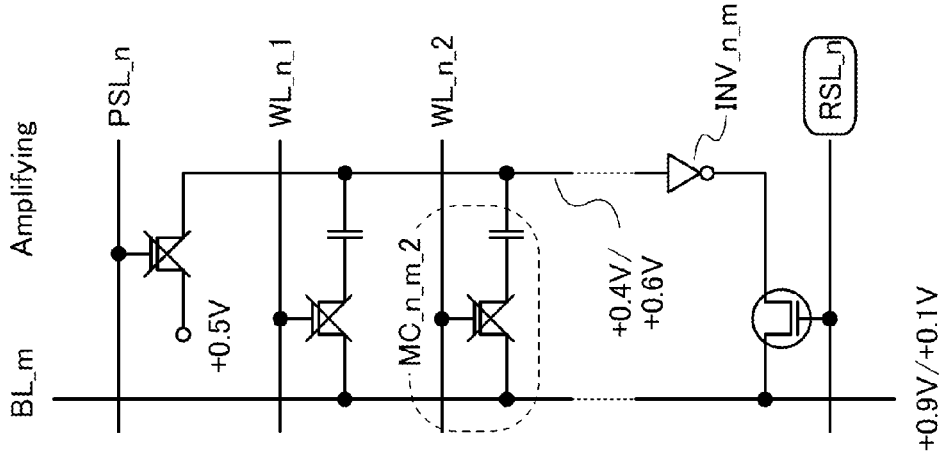
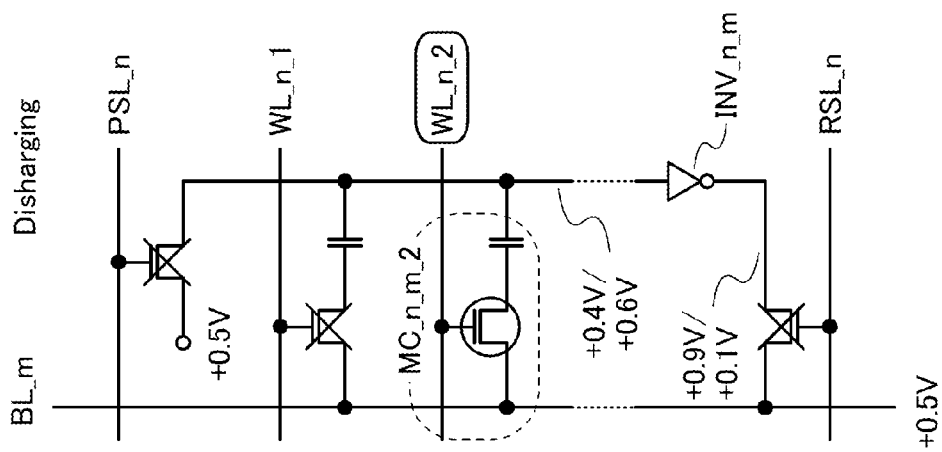

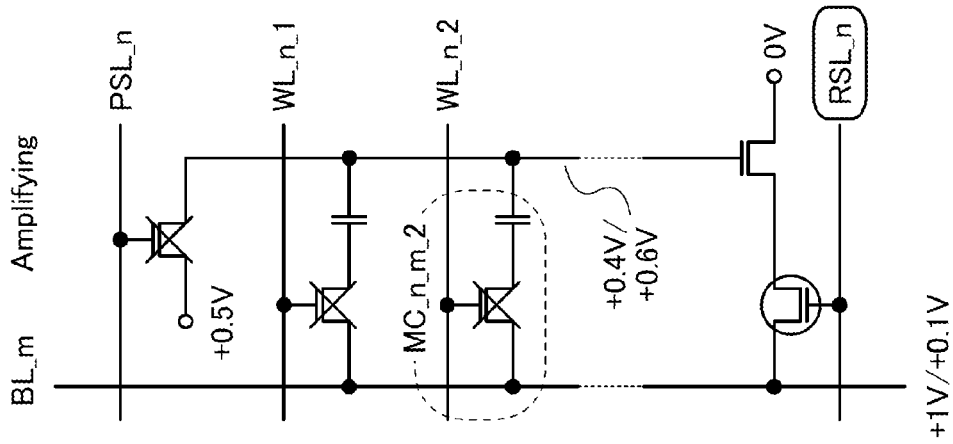
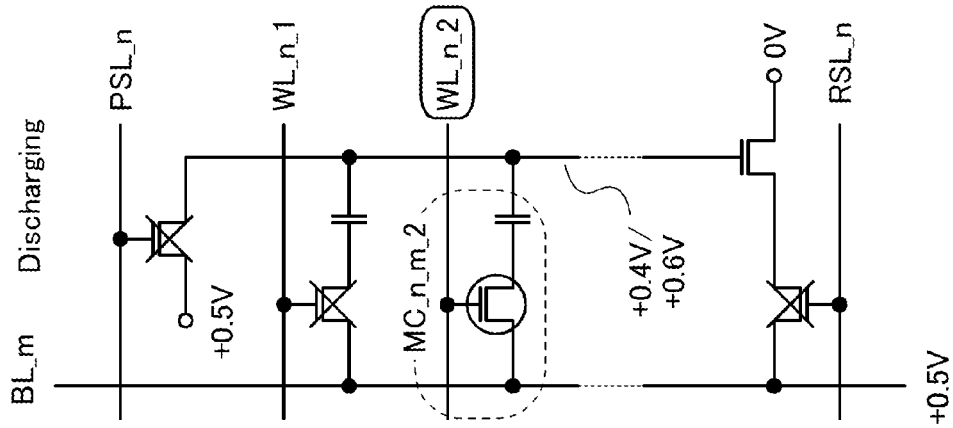
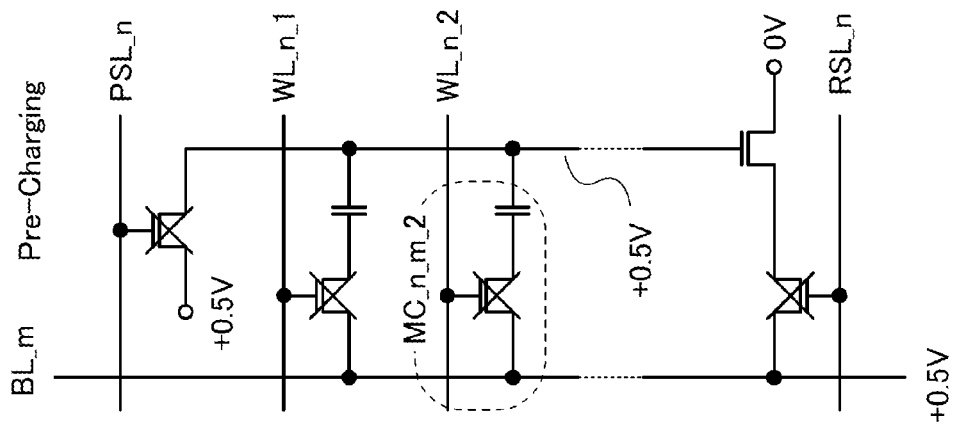

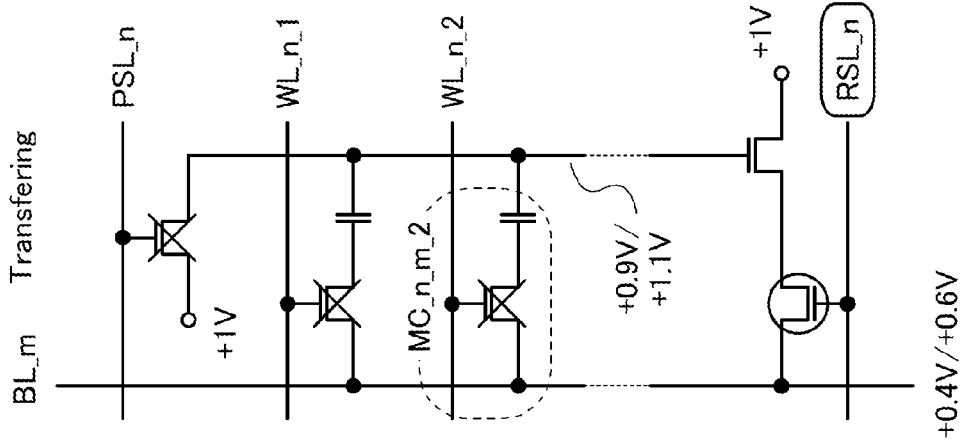
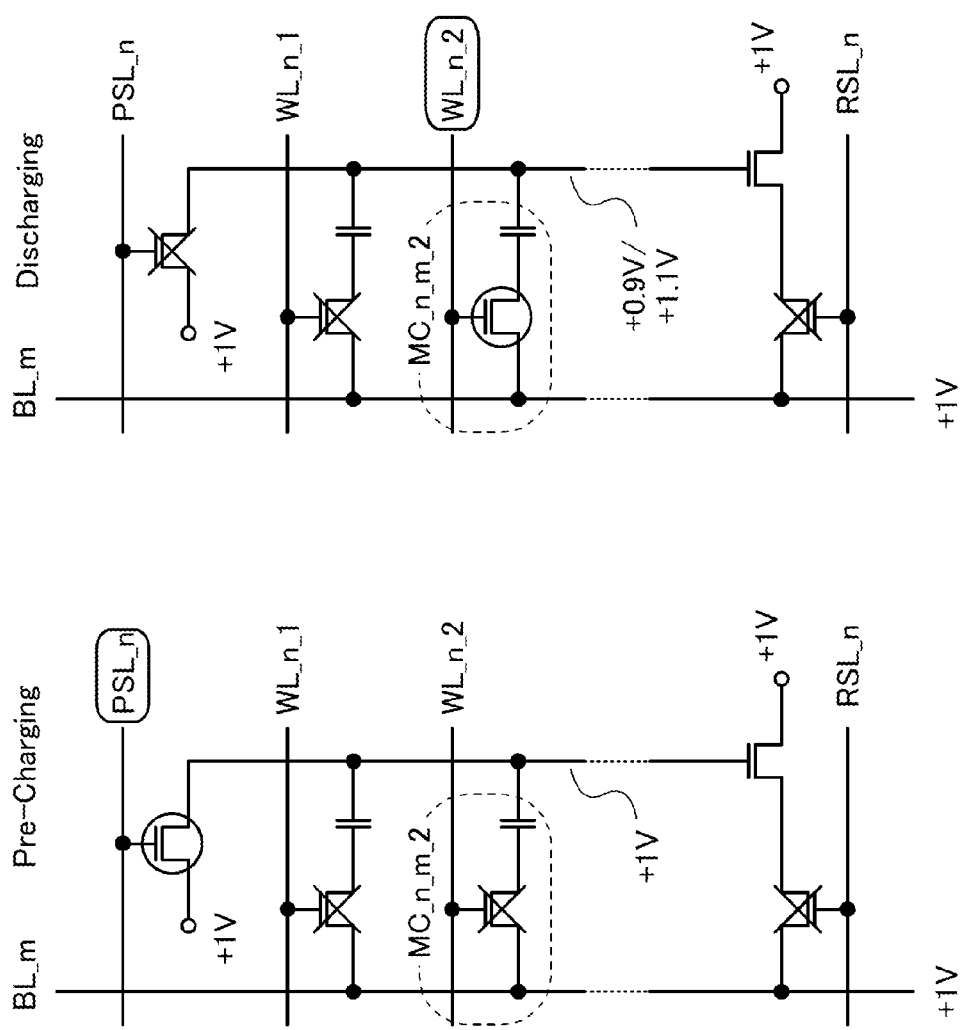
FIG. 11A  FIG. 11B  FIG. 11C

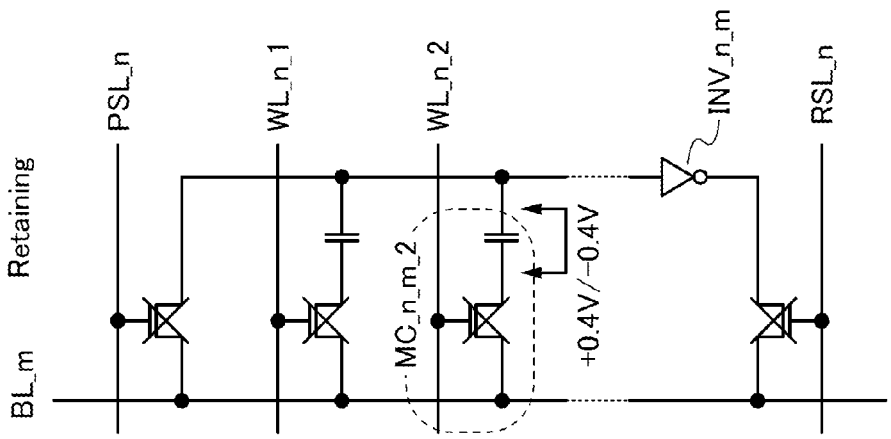
FIG. 13A Pre-Charging
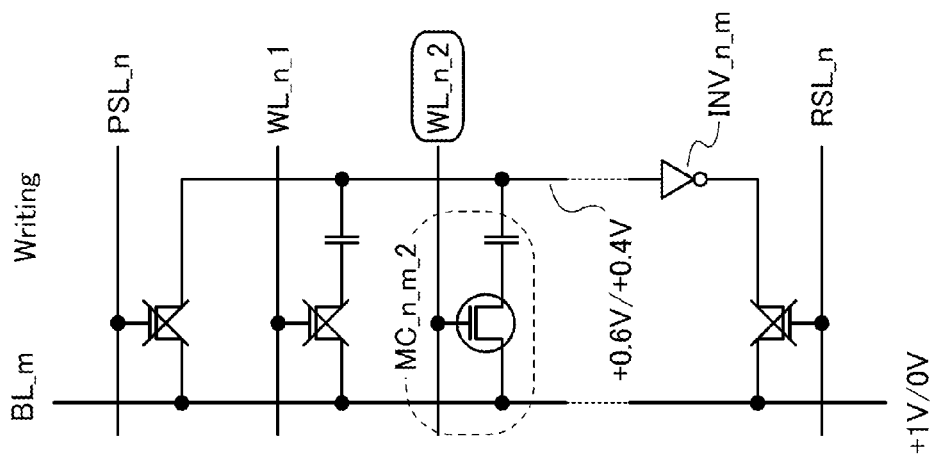
FIG. 13B Writing
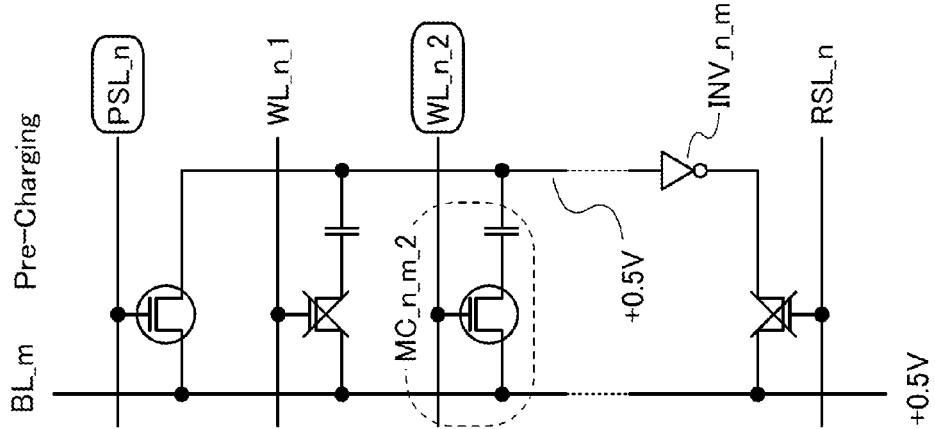
FIG. 13C Retaining

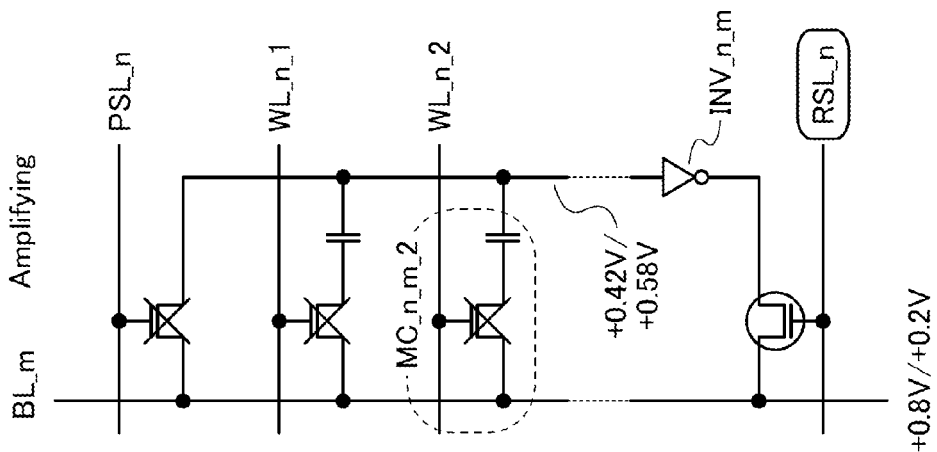
FIG. 14A Pre-Charging
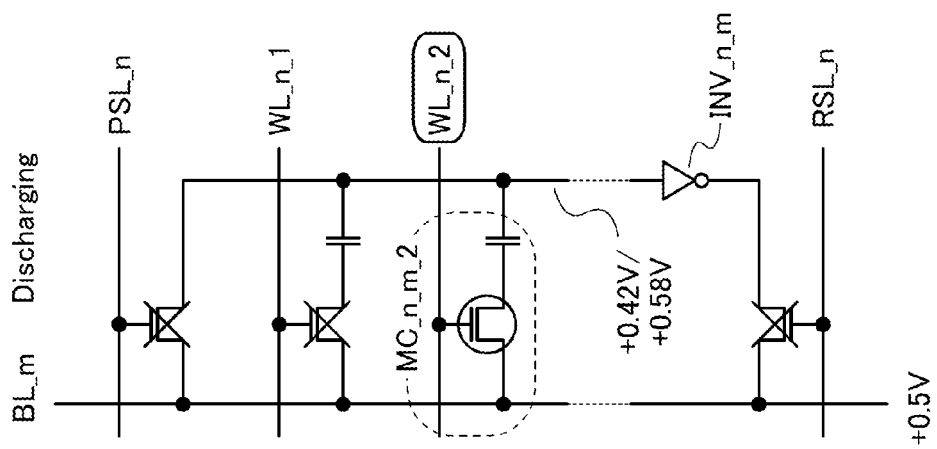
FIG. 14B Discharging
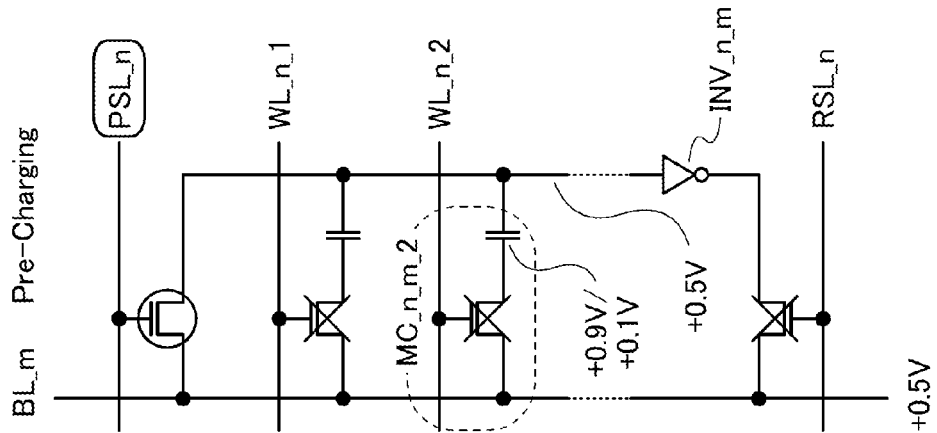
FIG. 14C Amplifying

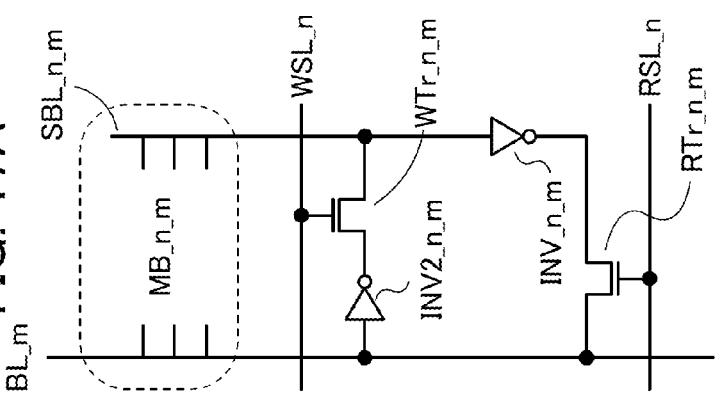
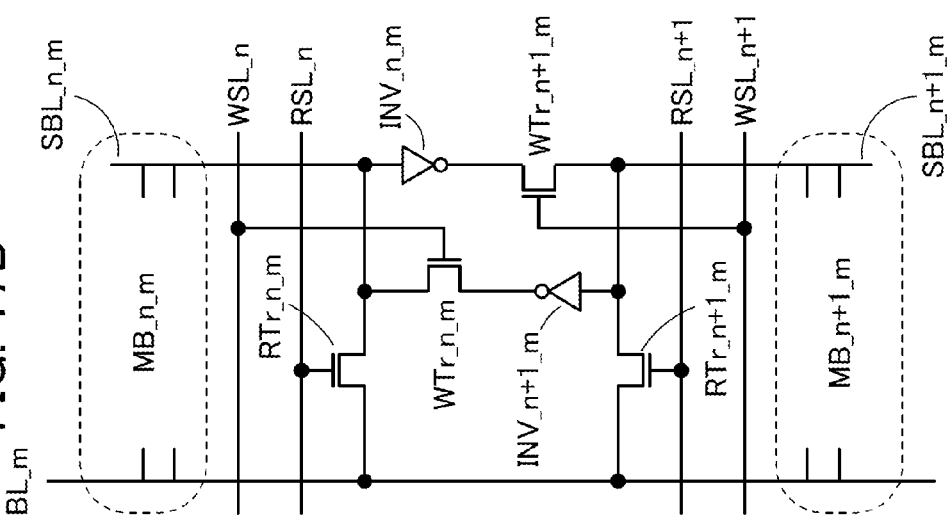
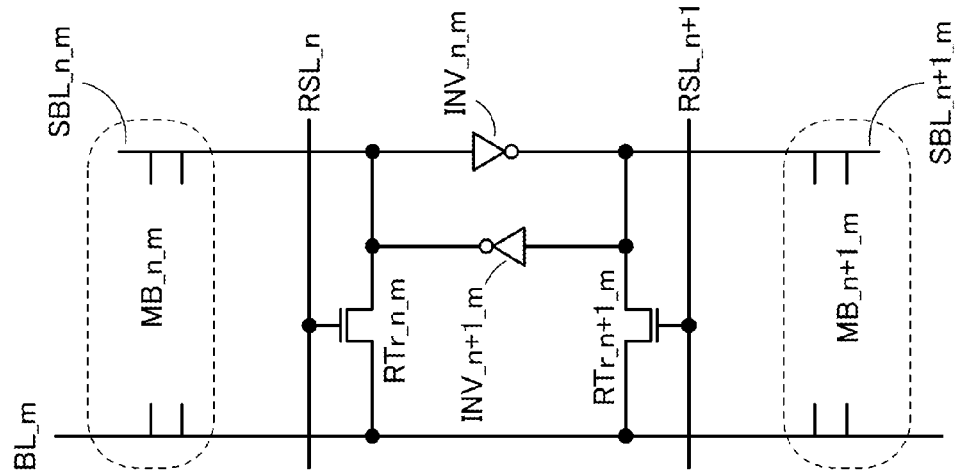

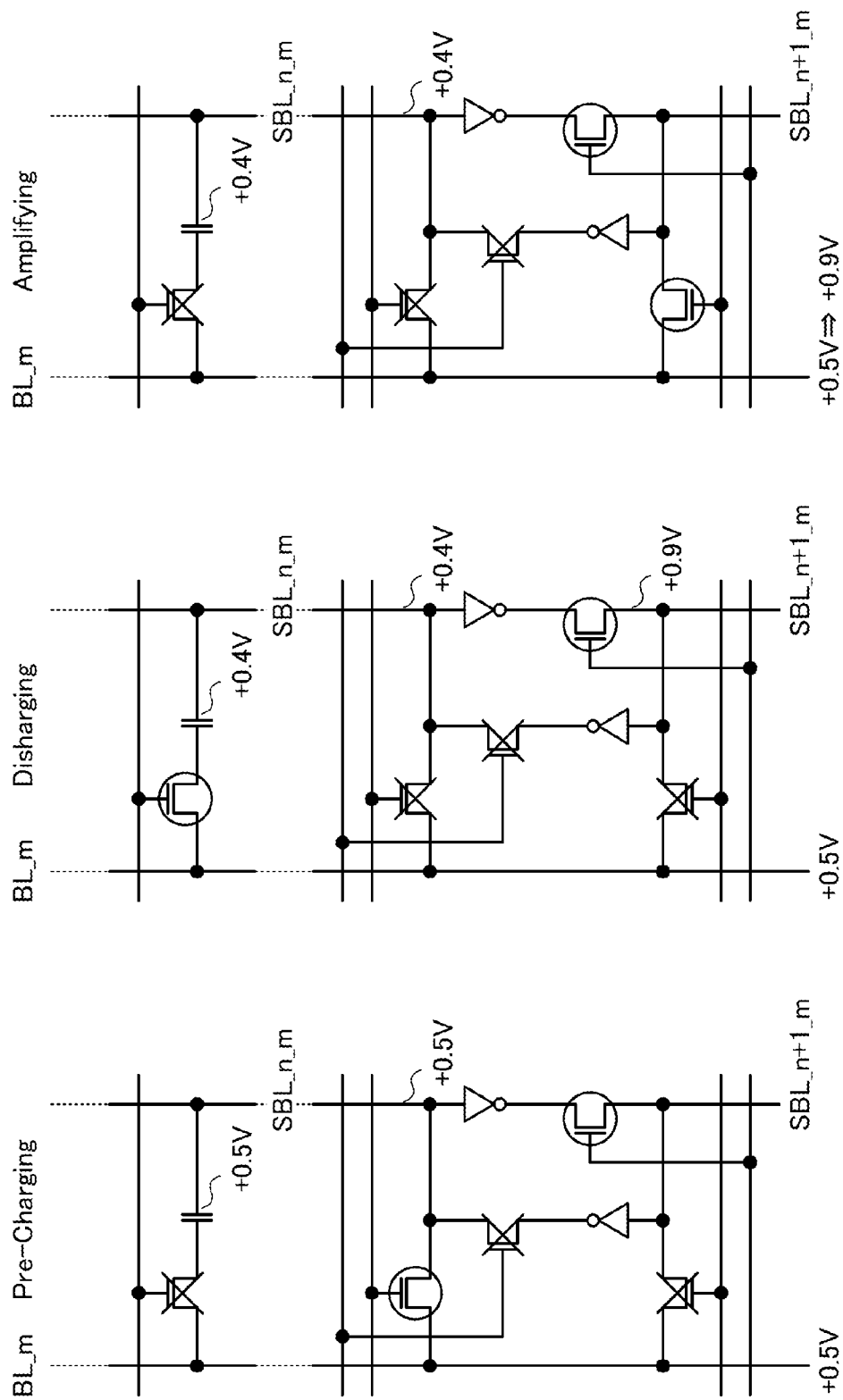

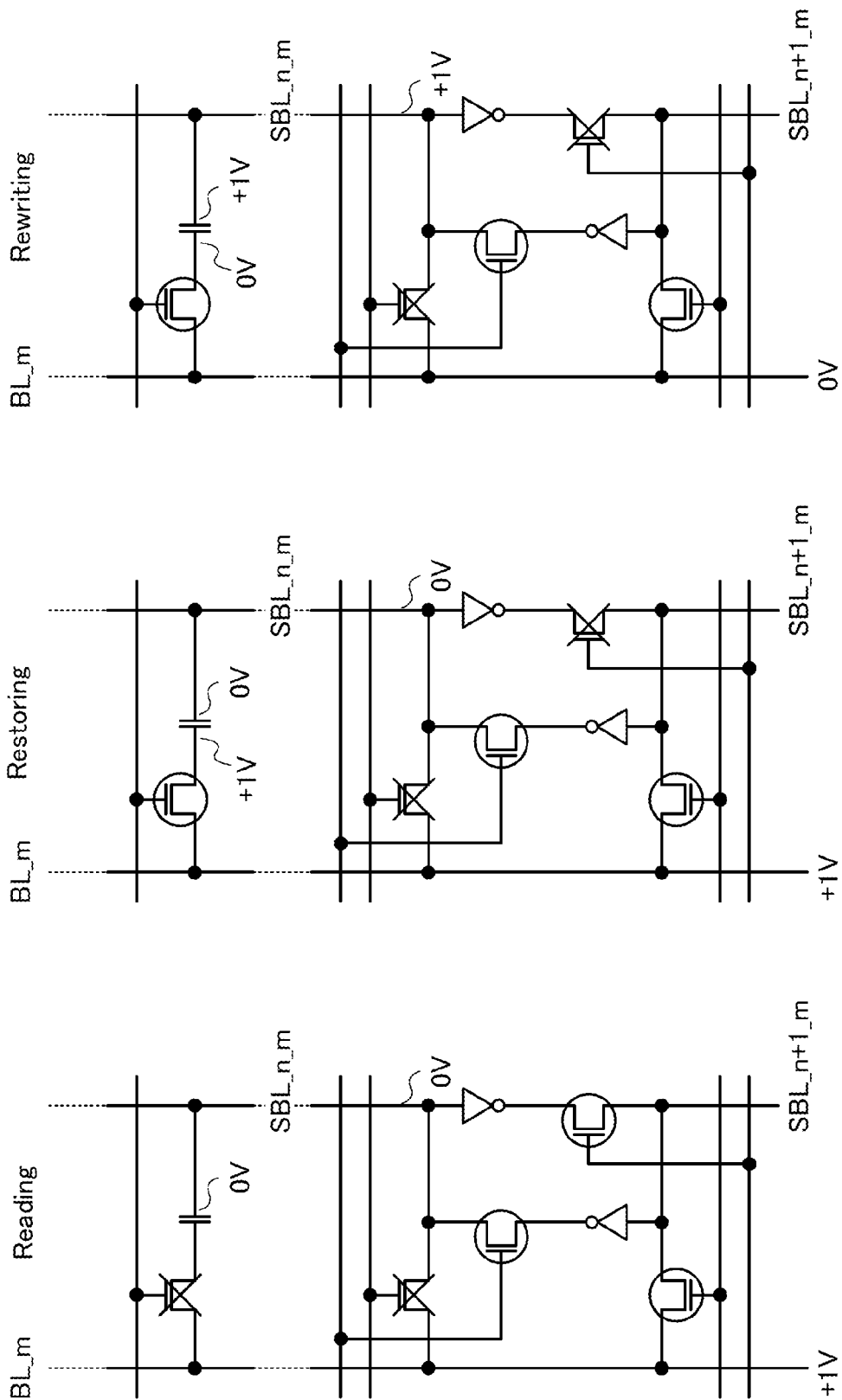

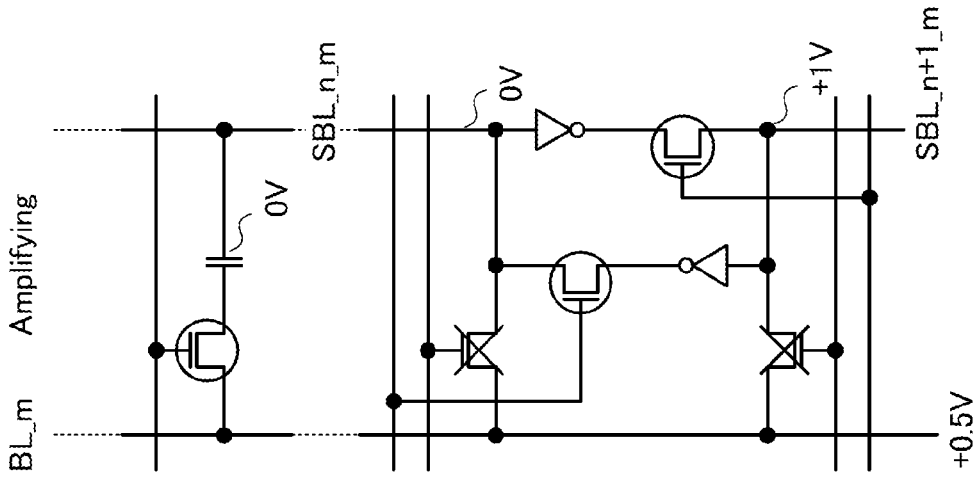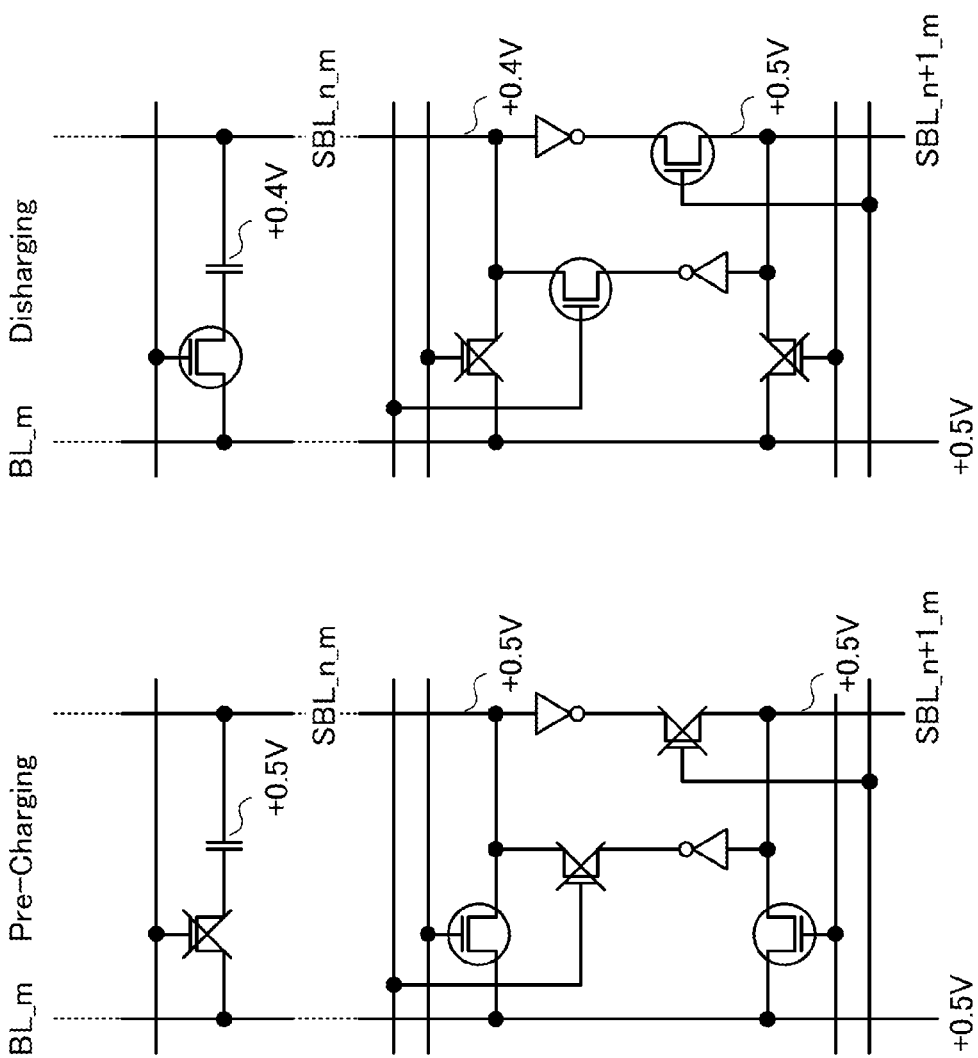

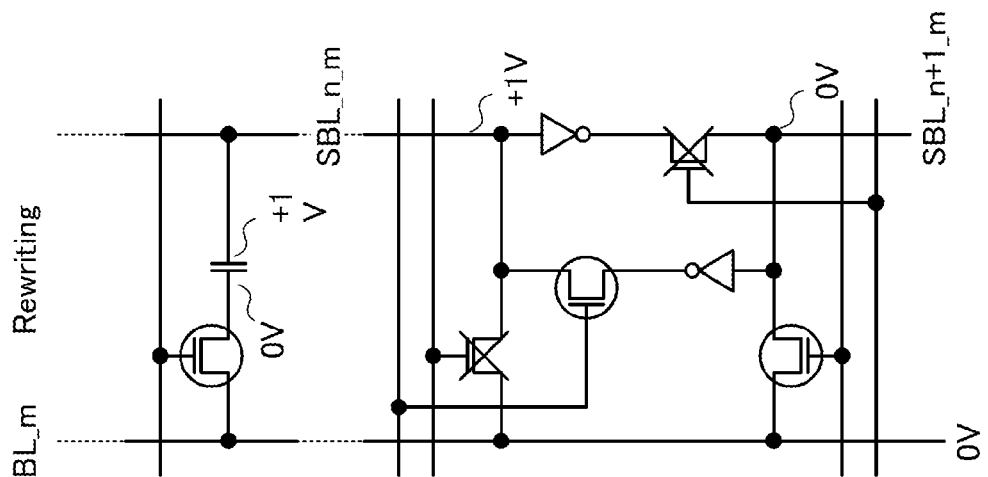
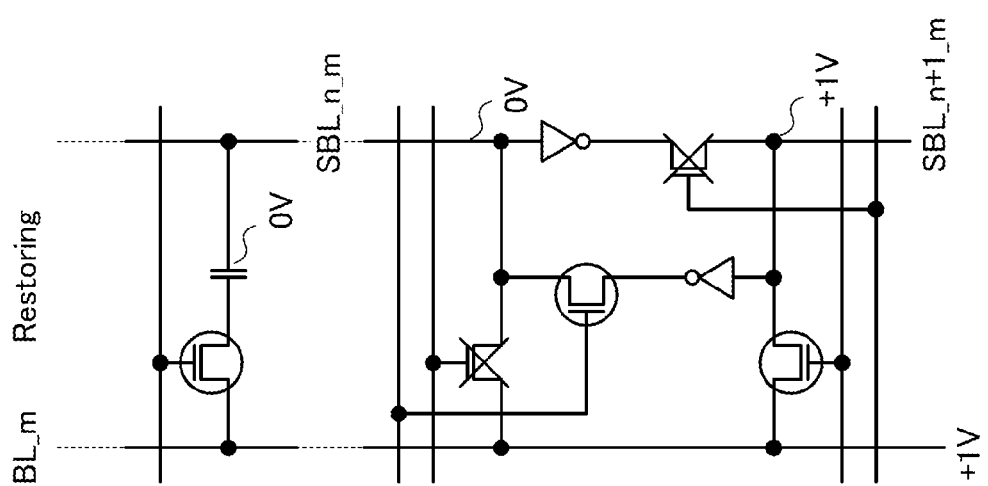
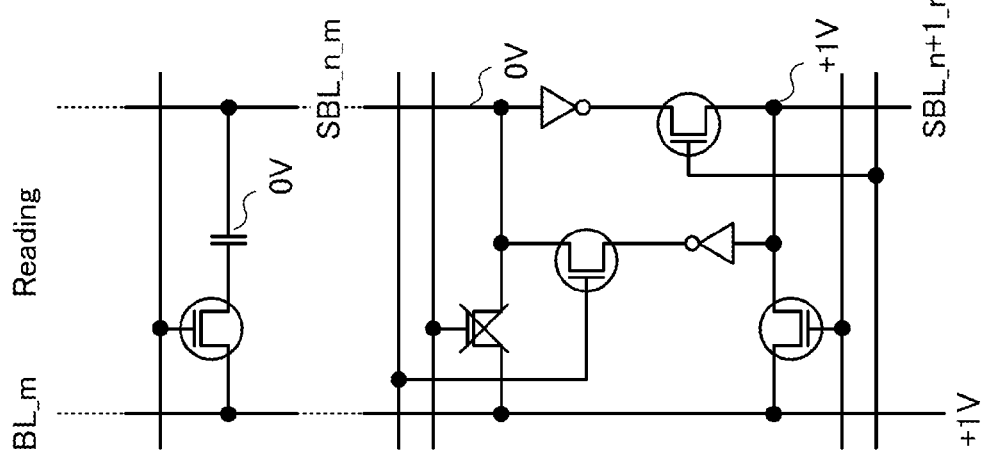

SEMICONDUCTOR MEMORY DEVICE INCLUDING AMPLIFIER CIRCUIT

BACKGROUND OF THE INVENTION

1. Field of the Invention

The present invention relates to a memory device using a semiconductor.

2. Description of the Related Art

Terms used in this specification will be briefly explained. First, when one of a source and a drain of a transistor is called a drain, the other is called a source in this specification. That is, they are not distinguished depending on the potential level. Therefore, a portion called a source in this specification can be alternatively referred to as a drain.

In this specification, "connection" means a structure in which effective direct current can be supplied at least temporarily. Therefore, a state of connection means not only a state of direct connection but also a state of indirect connection through a circuit element such as a wiring or a resistor, in which direct current can be supplied. It does not matter whether a circuit is actually designed so that direct current is supplied thereto.

For example, in the case where a switching element is provided between two nodes, direct current can be supplied in a certain condition (i.e., only when the switch is on); therefore, the structure can be expressed as "the nodes are connected to each other". On the other hand, in the case where only a capacitor is provided between two nodes, effective direct current cannot be supplied through the capacitor; therefore, the structure can be expressed as "the nodes are not connected to each other".

Similarly, in the case where only a diode is provided between nodes, direct current can be supplied when the potential of one of the nodes is higher; therefore, the structure can be expressed as "the nodes are connected to each other". In this case, even if potentials with which current does not flow are supplied to the two nodes because of the circuit design (in which case current does not actually flow between the two nodes through the diode), the structure is expressed as "the nodes are connected to each other" in this specification.

For example, in the case where a node A is in contact with a source of a transistor and a node B is in contact with a drain of the transistor, direct current can flow between the node A and the node B depending on the potential of a gate; thus, the structure is expressed as "the node A and the node B are connected to each other".

On the other hand, in the case where the node A is in contact with the source of the transistor and a node C is in contact with the gate of the transistor, effective direct current cannot flow between the node A and the node C regardless of the potentials of the source, drain, and gate of the transistor; thus, the structure is expressed as "the node A and the node C are not connected to each other".

In the above description, effective direct current refers to current excluding unintentional current such as leakage current. Note that the value of effective direct current is not defined by its amount (absolute value) and sometimes depends on circuits. That is, in some cases, a low current of 1 pA can be effective current in one circuit, whereas a higher current of 1 µA is not considered as effective current in another circuit.

Needless to say, in one circuit having an input and an output (e.g., an inverter), the input and the output are not necessarily connected to each other. Using the inverter as an example, the input and the output are not connected to each other in the inverter.

When the term "connect" is used in this specification, there is a case in which a physical connection is not clear in an actual circuit and a wiring is only extended. For example, in a circuit composed of insulated-gate field-effect transistors (hereinafter simply referred to as transistors), one wiring serves as gates of a plurality of transistors in some cases. In this case, one wiring that branches into gates may be illustrated in a circuit diagram. In this specification, the expression "a wiring is connected to a gate" may be used even in such a case.

Further, in this specification, in referring to a specific row, column, or position in a matrix, a reference sign is accompanied by a sign denoting coordinates as follows, for example: "precharge transistor PTr_n_m", "bit line BL_m" and "sub bit line SBL_n_m". When one element has a function relating to a plurality of rows or columns, the element may be represented by, for example, "amplifier circuit AMP_n/n+1_m".

On the other hand, when the row, column, or location of a component is not specified, when components are collectively treated, or when the location of a component is obvious, the following expressions may be used, for example: "precharge transistor PTr", "bit line BL", and "sub bit line SBL", or simply "precharge transistor", "bit line", and "sub bit line".

A DRAM whose memory cell includes one transistor and one capacitor can be highly integrated, has no limit on the number of write cycles in principle, and can perform write and read operations at relatively high speed; thus, such a DRAM is used in many kinds of electronic devices. In a DRAM, data is stored by accumulating electric charges in a capacitor of each memory cell and is read by releasing the electric charges to a bit line and amplifying a small potential change of the bit line (see Patent Document 1).

Capacitance (parasitic capacitance) exists between adjacent bit lines and between a bit line and a wiring (a word line and the like) intersecting with each other. The capacitance of the bit line is usually much higher than that of a capacitor. If the capacitance of the bit line is extremely higher than that of the capacitor, a potential change of the bit line when the electric charges accumulated in the capacitor is released to the bit line becomes extremely small, causing an error in amplifying a potential difference between the bit line and a reference potential. Accordingly, the capacitance of the capacitor is desirably 10% or higher of the capacitance of the bit line.

A capacitor in a miniaturized DRAM is formed to have a trench with a depth of as much as several micrometers or a stack with a height of as much as several micrometers, which increases difficulties in processing. Thus, it is necessary to reduce memory capacitance. Accordingly, an increase in the off-state resistance of a transistor of a memory cell has been suggested (see Patent Documents 2 and 3); at the same time, an error due to a decrease in the capacitance of a capacitor, described above, needs to be avoided.

Further, by miniaturization of a DRAM, variations in threshold voltages among transistors are increased. This is due to statistical fluctuation of dopant concentration. In a DRAM, a small potential change due to electric charges released from a capacitor of a memory cell to a bit line is amplified by a sense amplifier; however, when variations in threshold voltages among transistors included in the sense amplifier are increased, an error occurs at the time of amplification. The potential change of the bit line needs to be large so that the error is avoided.

To reduce power consumption and suppress short channel effect, a power supply voltage tends to be reduced; however, a potential change of a bit line at the time of reading is reduced by half if voltage for writing becomes half. On the other hand, there is also a problem in that reading accuracy is decreased with the reduction in power supply voltage since the lower limit of the potential change which can be amplified is almost fixed.

In order to solve these problems, a method is proposed in which bit lines are provided with sub bit lines and a sense amplifier of a flip-flop circuit type is connected to each of the sub bit lines so that data is read by comparison of the capacitance between the sub bit line and the capacitor (see Patent Document 4).

However, the semiconductor memory device disclosed in Patent Document 4 is applicable to folded-bit-line DRAMs, but not applicable to open-bit-line DRAMs, which are more highly integrated. In fact, the semiconductor memory device disclosed in Patent Document 4 has a problem in the degree of integration when being applied to a highly integrated device.

The sense amplifier of a flip-flop circuit type is apt to fail to work properly when the capacitance of the sub bit line is low. In general, the potential of an object with a low capacitance greatly changes because of effects of noise. A conventional DRAM has a capacitance of bit line of several hundred femtofarads; based on the simplest assumption, when the capacitance of sub bit line is several femtofarads, a potential change due to noise is increased a hundredfold.

In the sense amplifier of a flip-flop circuit type, a small potential difference of about 0.1 V is amplified in an early stage of amplification. In this case, when a potential change other than by signals becomes 0.1 V or higher, an error occurs. For example, in a conventional DRAM, the capacitance of a bit line (or a sub bit line) is high, so that a potential change other than by signals can be 1 mV; however, if the capacitance of the bit line (or the sub bit line) (plus the capacitance of one capacitor) is one hundredth or less of that in the conventional DRAM, the potential change other than by signals is 0.1 V or more.

In other words, in the semiconductor memory device disclosed in Patent Document 4, an error at the time of reading is apt to occur when the capacitance of the sub bit line is greatly reduced. In the semiconductor memory device disclosed in Patent Document 1, an extremely high off-state resistance of a transistor is not expected and the capacitance of the sub bit line and the capacitance of one capacitor are expected to be as high as several hundreds of femtofarads or more and as high as several tens of femtofarads or more, respectively; therefore, Patent Document 1 does not disclose any solution to the case where the capacitance of the capacitor is several ten of femtofarads or lower, for example.

REFERENCES

Patent Document

[Patent Document 1] U.S. Pat. No. 5,764,562
[Patent Document 2] United States Patent Application Publication No. 2011/0156027
[Patent Document 1] U.S. Pat. No. 7,772,053
[Patent Document 1] U.S. Pat. No. 5,353,255

SUMMARY OF THE INVENTION

An object of one embodiment of the present invention is to provide a highly integrated semiconductor memory device. Further, an object of one embodiment of the present invention is to provide a semiconductor memory device which is excellent in mass productivity. Furthermore, an object of one embodiment of the present invention is to provide a highly reliable semiconductor memory device.

Further, an object of one embodiment of the present invention is to provide a highly integrated memory device which sufficiently functions even when the capacitance of a capacitor is lower than or equal to that in a conventional DRAM, specifically 1 fF or lower. Furthermore, an object of one embodiment of the present invention is to provide a memory device which sufficiently functions even when the capacitance of a capacitor is ten or less times as high as the gate capacitance of a transistor used.

Further, an object of one embodiment of the present invention is to provide a memory device having a novel structure or a method for driving the memory device. In particular, it is an object of one embodiment of the present invention to provide a memory device in which power consumption can be reduced and a driving method of the memory device in which power consumption can be reduced.

One embodiment of the present invention is a semiconductor memory device including one or more bit lines, four or more, preferably 16 or more word lines, two or more, preferably eight or more memory blocks. Each memory block has two or more memory cells and a sub bit line. Each memory cell includes one or more transistors and one or more capacitors, and a drain of the one or more transistors is connected to either one of the one or more bit lines or the sub bit line. Further, one electrode of the one or more capacitors is connected to the other of the one or more bit lines or the sub bit line.

Further, the sub bit line is connected to one of a reading transistor and an amplifier circuit, and the other of the reading transistor and the amplifier circuit is connected to the one or more bit lines. Further, a selection transistor and the amplifier circuit are connected to each other.

Various circuits can be used for the amplifier circuit. For example, an n-channel transistor, a p-channel transistor, a complementary inverter, a resistive load inverter, a flip-flop circuit, a combination thereof, or the like can be used.

One embodiment of the present invention is a method for driving the semiconductor memory device having any of the above structures, which includes the steps of setting a potential of the one or more bit lines to a potential corresponding to one bit of data to be written while a potential of the sub bit line is set to a specific potential, and turning on the one or more transistors of one of the memory cells so that the bit of data is written.

One embodiment of the present invention is a method for driving the semiconductor memory device having any of the above structures, which includes the steps of setting the potential of the one or more bit lines to be the same as or different from that of the sub bit line while the potential of the sub bit line is set to a specific potential in a floating state, and amplifying or transferring a potential change of the sub bit line caused by turning on the one or more transistors of one of the memory cells connected to the bit line so that the bit of data is written.

In the above, a precharge transistor may be included in each memory block. Further, in one of the memory blocks, the precharge transistor and the one or more transistors of one of the memory cells may be provided in different layers. Furthermore, in one of the memory blocks, a semiconductor used in the precharge transistor and a semiconductor used in the one or more transistors of one of the memory cells may be of different kinds. In one of the memory blocks, the one or more transistors of one of the memory cells and the one or more transistors of another memory cell may be provided in different layers.

In the above, the amplifier circuit may include two to eight transistors. Further, the amplifier circuit may include one n-channel transistor or one p-channel transistor. One memory block may include 4 to 64 memory cells. Furthermore, a necessary depth or a necessary height for the capacitor may be 1 μm or less, preferably 0.3 μm or less.

By employing any of the above-described structures, at least one of the above-described objects can be achieved. In any of the above-described structures, a capacitor wiring (a counter electrode of the capacitor of the memory cell) can be used for either the sub bit line or the bit line. Thus, the number of manufacturing steps can be reduced; the yield can be improved; and/or the degree of integration can be increased because of applicability to open-bit-line DRAMs. Note that if the present invention is applied to folded-bit-line DRAMs, an advantageous effect which has not been obtained in a conventional technique can be obtained.

Further, according to one embodiment of the present invention, the capacitance of a capacitor can be lower than or equal to 1 fF or lower, preferably 0.1 fF or lower by the use of a transistor having sufficiently high off-state resistance in a memory cell. A capacitor with such low capacitance makes it unnecessary to form a structure body with a high aspect ratio, which is included in a conventional DRAM.

Problems of a conventional DRAM are not only difficulty in manufacturing a structure body having such a unique shape but also difficulty in improving the memory density by manufacturing a memory device having a multilayer structure with the use of those structure bodies. In view of the above problem, when one embodiment of the present invention in which such a structure body is not needed is utilized, a multilayer technique in which a memory cell is stacked over a memory cell can be realized.

Note that when a thin film transistor is used as a transistor of a memory cell, a bit line and a sub bit line may be provided under the thin film transistor (may be provided on the substrate side) and over the thin film transistor, respectively. Alternatively, the bit line and the sub bit line may be provided over the transistor and under the transistor, respectively. In either case, the degree of integration is improved.

Further, according to one embodiment of the present invention, electric charges are released to the sub bit line whose capacitance is sufficiently low at the time of data reading, so that a potential change of the sub bit line becomes sufficiently large. Accordingly, an error at the time of amplification can be reduced even if the amplifier circuit is formed using transistors with large variations in threshold voltages; therefore, the defect rate in manufacturing can be reduced. Further, a highly reliable semiconductor memory device can be obtained.

Note that one embodiment of the present invention may function effectively in a semiconductor memory device including a capacitor that has capacitance with a normal value, and may exhibit a significant effect.

BRIEF DESCRIPTION OF THE DRAWINGS

FIGS. 9A to 9C are diagrams illustrating an example of a method for driving a semiconductor memory device of the present invention.

FIGS. 10A to 10C are diagrams illustrating an example of a method for driving a semiconductor memory device of the present invention.

FIGS. 11A to 11C are diagrams illustrating an example of a method for driving a semiconductor memory device of the present invention.

FIGS. 13A to 13C are diagrams illustrating an example of a method for driving a semiconductor memory device of the present invention.

FIGS. 14A to 14C are diagrams illustrating an example of a method for driving a semiconductor memory device of the present invention.

FIGS. 17A to 17C are diagrams each illustrating an example of a circuit of a semiconductor memory device of the present invention.

FIGS. 18A to 18C are diagrams illustrating an example of a method for driving a semiconductor memory device of the present invention.

FIGS. 19A to 19C are diagrams illustrating an example of a method for driving a semiconductor memory device of the present invention.

FIGS. 20A to 20C are diagrams illustrating an example of a method for driving a semiconductor memory device of the present invention.

FIGS. 21A to 21C are diagrams illustrating an example of a method for driving a semiconductor memory device of the present invention.

DETAILED DESCRIPTION OF THE INVENTION

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

Embodiment 1

Figure 1:
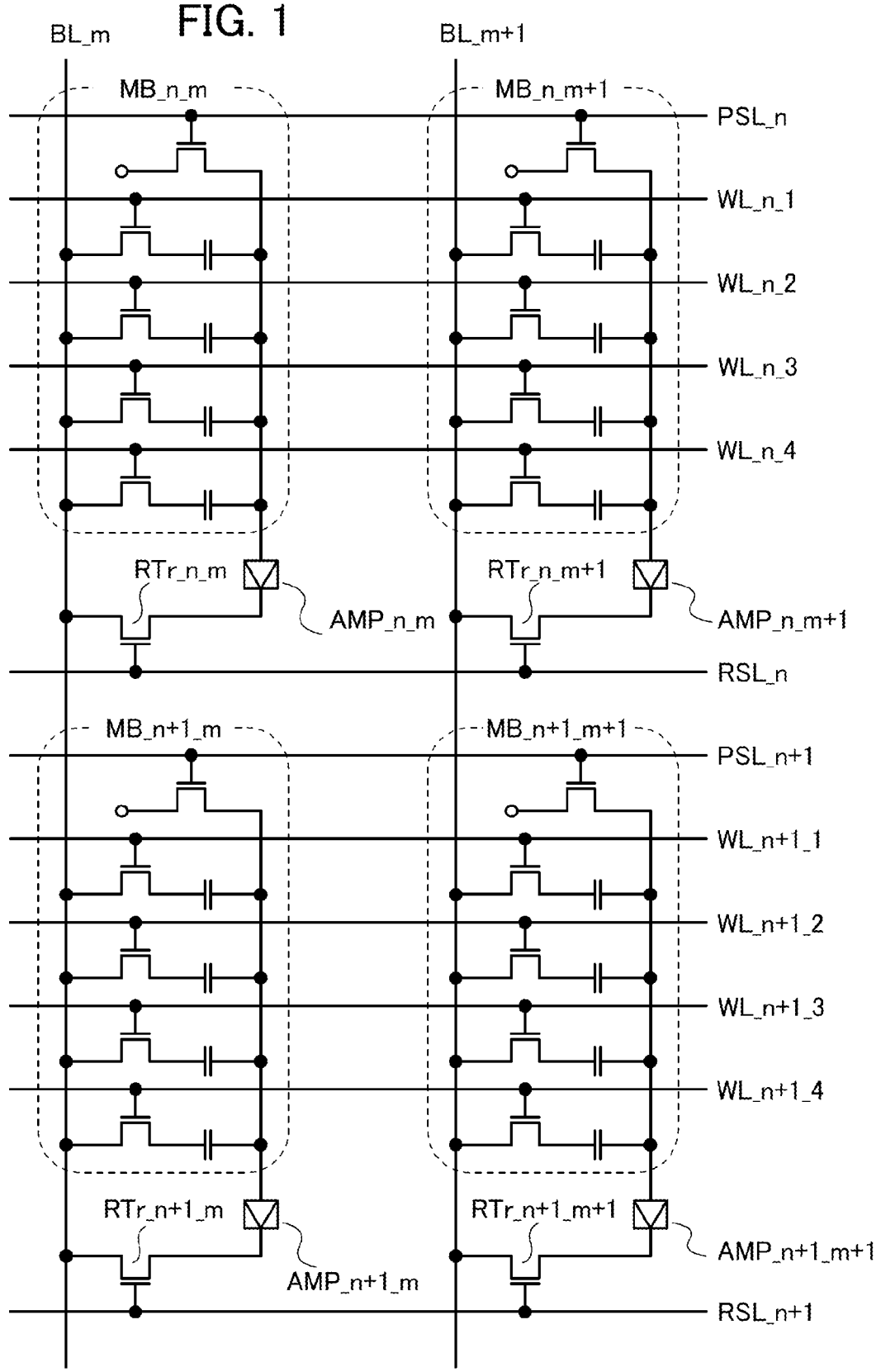
FIG. 1 is a diagram illustrating an example of a circuit of a semiconductor memory device of the present invention.

FIG. 1 illustrates a semiconductor memory device of this embodiment. FIG. 1 illustrates a memory block MB_n_m, a memory block MB_n_m+1, a memory block MB_n+1_m, and a memory block MB_n+1_m+1. In addition, a bit line BL_m, a bit line BL_m+1, a precharge selection line PSL_n, a precharge selection line PSL_n+1, a word line WL_n_1, a word line WL_n_2, a word line WL_n_3, a word line WL_n_4, a word line WL_n+1_1, a word line WL_n+1_2, a word line WL_n+1_3, and a word line WL_n+1_4, which are connected to the memory blocks MB, are illustrated.

Further, FIG. 1 also illustrates a reading transistor RTr_n_m, a reading transistor RTr_n_m+1, a reading transistor RTr_n+1_m, a reading transistor RTr_n+1_m+1, an amplifier circuit AMP_n_m, an amplifier circuit AMP_n_m+1, an amplifier circuit AMP_n+1_m, and an amplifier circuit AMP_n+1_m+1.

Further, the reading transistor RTr_n_m, the reading transistor RTr_n_m+1, the reading transistor RTr_n+1_m, and the reading transistor RTr_n+1_m+1 are controlled by a reading selection line RSL_n, and a reading selection line RSL_n+1.

Figure 5A:
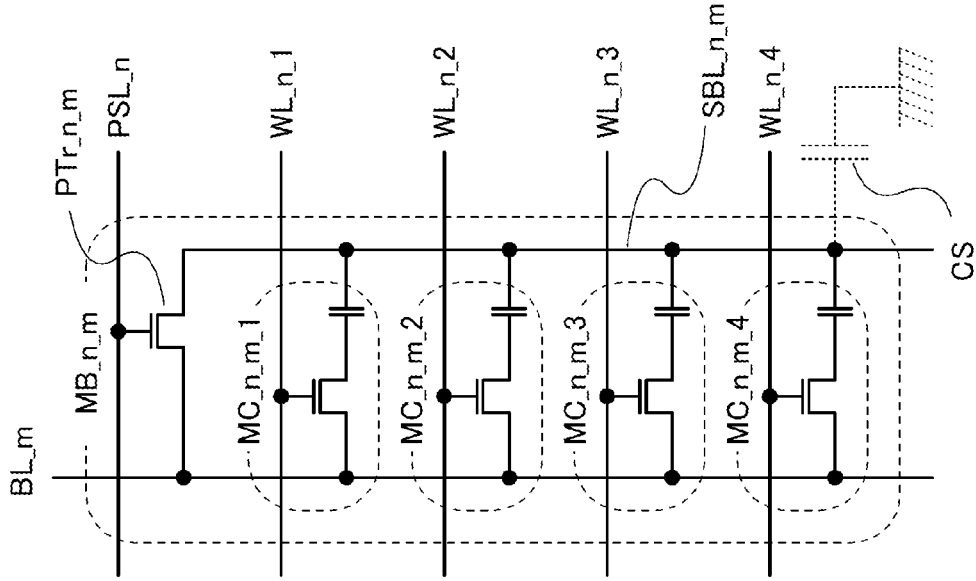
FIGS. 5A and 5B are diagrams each illustrating an example of a circuit of a semiconductor memory device of the present invention.

FIG. 5A illustrates an example of a memory block MB. The memory block MB_n_m includes four memory cells MC, a memory cell MC_n_m_1, a memory cell MC_n_m_2, a memory cell MC_n_m_3, and a memory cell MC_n_m_4; however, the number of the memory cells MC may be three or less, or five or more.

Each memory cell includes one transistor and one capacitor. A gate of the transistor is connected to a word line WL, a drain of the transistor is connected to the bit line BL_m, and a source of the transistor is connected to one electrode of the capacitor. The other electrode of the capacitor is connected to a sub bit line SBL_n_m.

The memory block MB_n_m includes a precharge transistor PTr1_n_m whose gate is connected to the precharge selection line PSL_n, source is connected to the sub bit line SBL_n_m, and drain is connected to a wiring for supplying a necessary potential. In the case where a wiring to be connected to the drain of the precharge transistor PTr_n_m is provided, the wiring is preferably provided in parallel to the word lines.

Note that the reading transistor which is in the same memory block as the precharge transistor or in another memory block may serve as the precharge transistor as described later. Alternatively, a structure in which the precharge transistor is not included in a memory block MB may be employed.

Note that capacitance CS including parasitic capacitance exists at the sub bit line SBL_n_m. The capacitance CS is preferably ten times or less as high as that of the capacitor of the memory cell. The sub bit line SBL_n_m of the memory block illustrated in FIG. 5A is formed using a capacitor wiring.

Figure 5B:
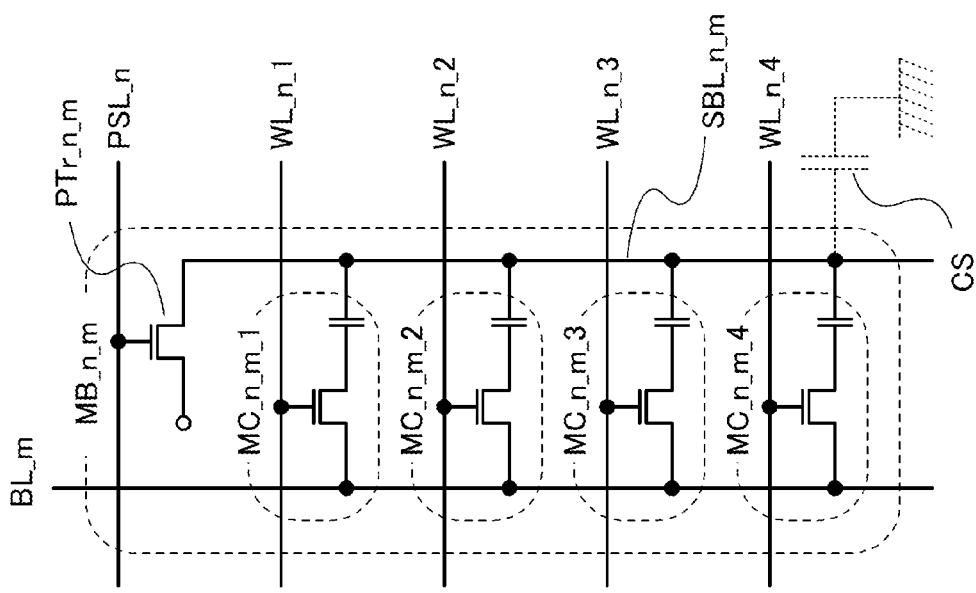

FIG. 5B illustrates another example of the memory block MB. The difference between the memory blocks in FIGS. 5A and 5B is a portion to which the drain of the precharge transistor PTr_n_m is connected. In the memory block illustrated in FIG. 5B, the drain of the precharge transistor PTr_n_m is connected to the bit line BL_m. However, in the memory block illustrated in FIG. 5B, the drain of the precharge transistor PTr_n_m may be connected to another bit line BL.

Figure 6A:
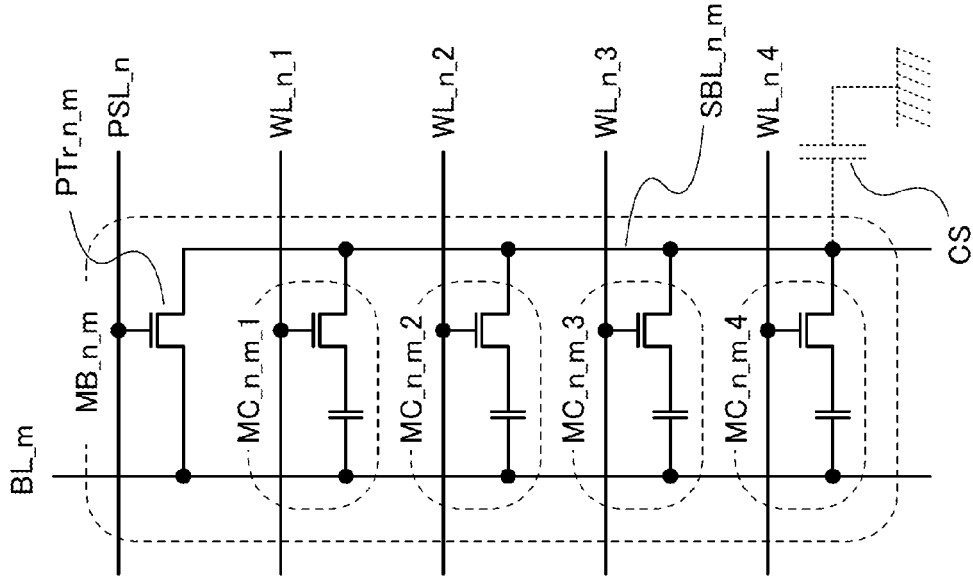
FIGS. 6A and 6B are diagrams each illustrating an example of a circuit of a semiconductor memory device of the present invention.
Figure 6B:
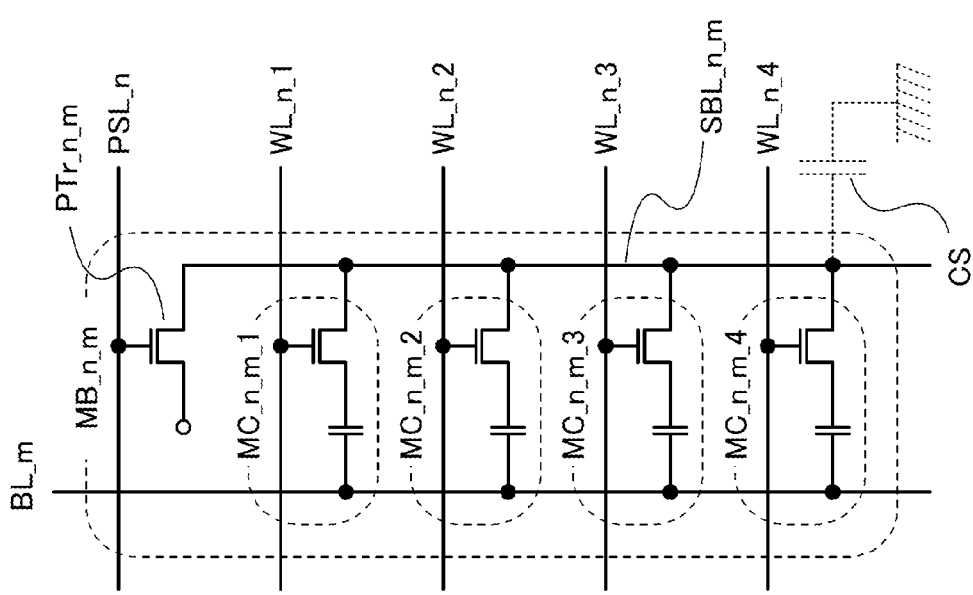

FIGS. 6A and 6B each illustrate another example of the memory block MB. The difference between the memory blocks in FIG. 6A and FIG. 5A is connection between a transistor and a capacitor in a memory cell.

In the memory block in FIG. 6A, a drain of a transistor is connected to a sub bit line, one electrode of the capacitor is connected to a bit line, and a source of the transistor is connected to the other electrode of the capacitor. The same can be said in the difference between the memory blocks in FIG. 6B and FIG. 5B. That is, a capacitor wiring is used for the bit line BL_m of the memory block illustrated in FIGS. 6A and 6B.

As illustrated in FIG. 1, the potential of an output terminal of the memory block MB_n_m (that is, the potential of the sub bit line SBL_n_m in FIGS. 5A and 5B and FIGS. 6A and 6B) is input to the amplifier circuit AMP_n_m, and an output terminal of the amplifier circuit AMP_n_m is connected to the bit line BL_m through the reading transistor RTr_n_m. The on/off of the reading transistor RTr_n_m is controlled by the reading selection line RSL_n.

Figure 7A:
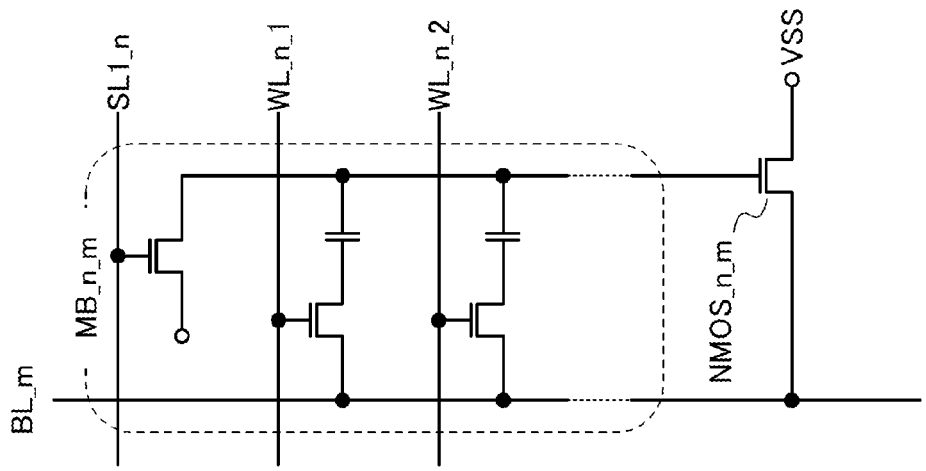
FIGS. 7A to 7C are diagrams each illustrating an example of a circuit of a semiconductor memory device of the present invention.
Figure 7B:
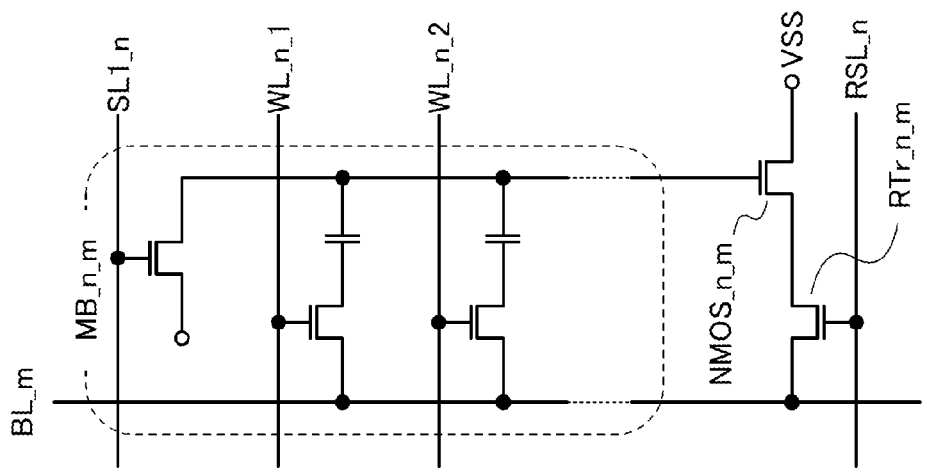

As an amplifier circuit AMP, an n-channel transistor, a p-channel transistor, a complementary inverter, a resistive load inverter, a flip-flop circuit, or the like can be used. For example, an inverter INV_n_m may be used as the amplifier circuit AMP as illustrated in FIG. 7A. Alternatively, an n-channel transistor NMOS_n_m may be used as the amplifier circuit AMP as illustrated in FIG. 7B. Similarly, a p-channel transistor can also be used as the amplifier circuit AMP.

Figure 7C:
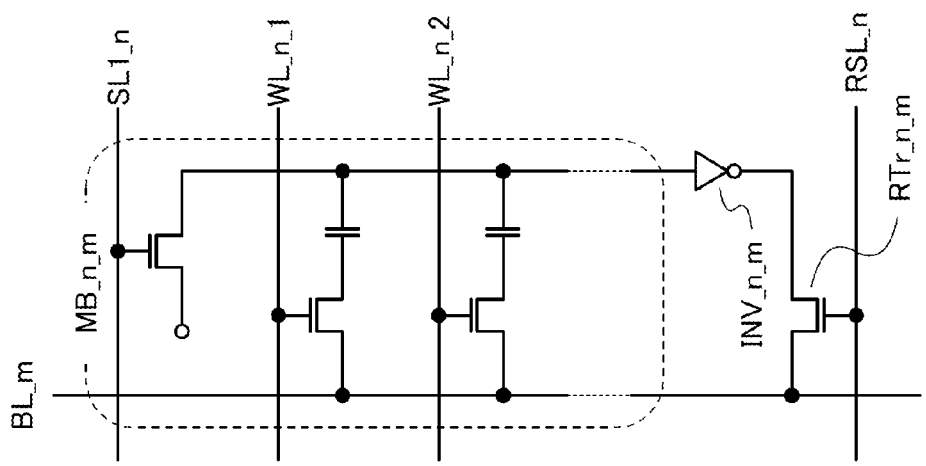

Note that in FIG. 7B, the n-channel transistor NMOS_n_m is connected to the bit line BL through the reading transistor RTr_n_m; however, in the case where an n-channel transistor or a p-channel transistor is used, the semiconductor memory device can operate without the reading transistor RTr_n_m as illustrated in FIG. 7C.

Various semiconductors can be used for the precharge transistor PTr, the reading transistor RTr, the transistor in each memory cell MC, and the transistor used for the amplifier circuit AMP. For example, all those transistors can be formed using the same semiconductor material. For example, those transistors may be formed using a single crystal silicon semiconductor substrate.

Alternatively, the precharge transistor PTr, the reading transistor RTr, and the transistor used for the amplifier circuit AMP may be manufactured using a single crystal silicon semiconductor substrate, while the transistor included in the memory cell MC is formed using a thin semiconductor layer. In that case, for the thin semiconductor layer, single crystalline silicon, polycrystalline silicon, or a semiconductor other than silicon, an example of which is an oxide semiconductor, may be used.

Particularly in the case of an oxide semiconductor having a band gap of three electron volts or more, by making the concentration of donors or acceptors $1 \times 10^{12}$ cm$^{-3}$ or lower, the resistance in an off state can be extremely high. In other words, by optimizing the potential of a gate, the resistance between a source and a drain can be $1 \times 10^{24} \Omega$ or higher. For example, even when the capacitance of a memory cell is $1 \times 10^{-17}$ F, which is less than or equal to one thousandth of the capacitance of a memory cell of a conventional DRAM, a time constant is $1 \times 10^{7}$ seconds (115 days), and data can be held for a long period, which cannot be assumed in a conventional DRAM.

In other words, refresh operation (rewriting of data for the purpose of compensating a reduction in electric charges accumulated in a capacitor) which needs to be performed even ten or more times per second in a conventional DRAM becomes unnecessary in continuous use for several ten hours.

At the time of data writing in a DRAM, much of current flowing in a bit line is used for charging and discharging of parasitic capacitance between the bit lines in addition to for charging of a capacitor of a memory cell. Since parasitic capacitance between the bit lines increases as the wiring width decreases, in the present situation of higher integration, current ten or more times as high as current needed for charging of the capacitor of the memory cell is used for charging and discharging of the parasitic capacitance between the bit lines.

Needless to say, charging and discharging of parasitic capacitance between the bit lines is a phenomenon not related to data holding, and performing refreshing leads an increase in power consumption. In view of that, a reduction in the number of times of refreshing or omission of refreshing is effective in suppressing power consumption.

Examples of a method for writing data to the memory block MB and a method for reading data from the memory block MB will be described below. Note that data can also be written or read using a method other than the methods described below. Specific numeric values of a potential and the like are given below; however, potentials other than such a potential can, of course, be used. In the following example, the capacitance CS of the sub bit line SBL_n_m is four times as high as the capacitance of the capacitor of the memory cell MC.

First, a method for writing data in the case of using the memory block illustrated in FIG. 5A and an inverter as an amplifier circuit, and the like will be described with reference to FIGS. 8A to 8C. Note that the method for writing data can be conducted regardless of the kind of the amplifier circuit. Here, an example is given in which one bit of data is written into the memory cell MC_n_m_2.

Figure 8A:
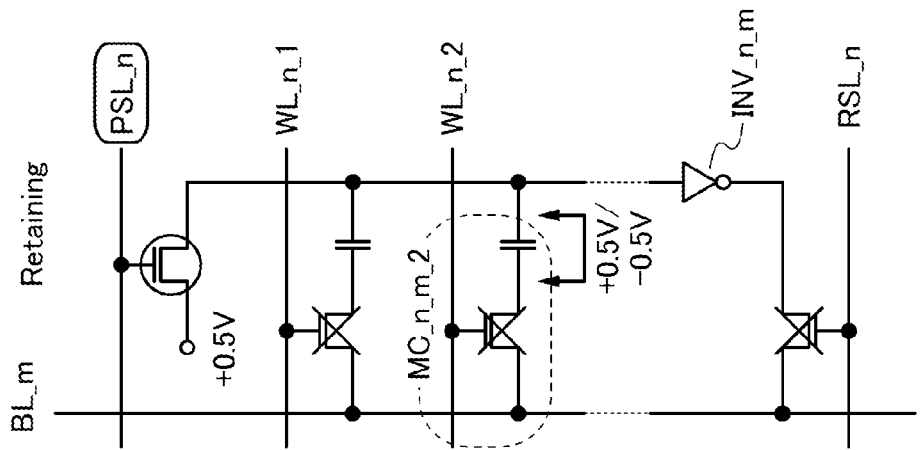
FIGS. 8A and 8C are diagrams illustrating an example of a method for driving a semiconductor memory device of the present invention.

First, the precharge transistor PTr_n_m is turned on, and the potential of the sub bit line SBL_n_m is set to +0.5 V (see FIG. 8A).

Figure 8B:
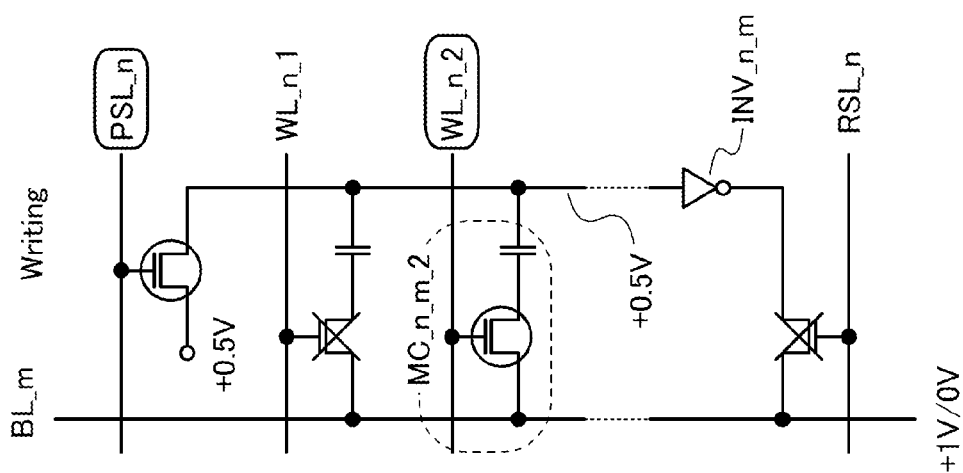
Figure 8C:
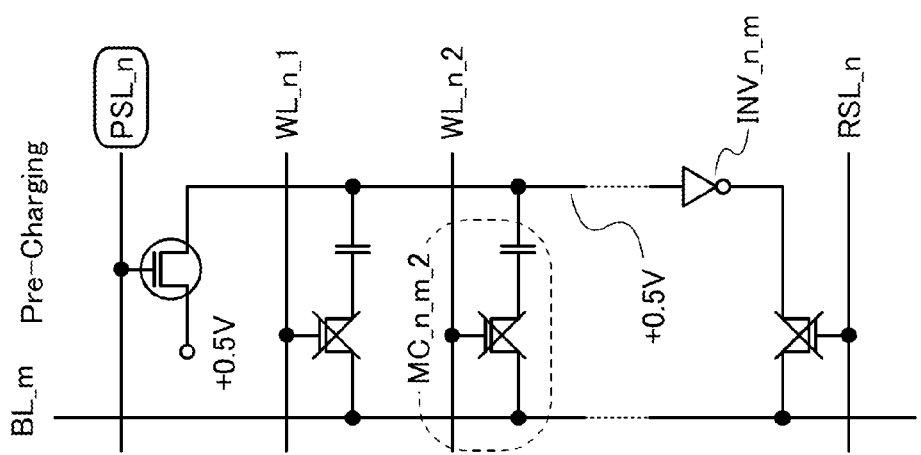

Next, the potential of the bit line BL_m is set to a potential corresponding to one bit of data (here, +1 V or 0 V), and the transistor of the memory cell MC_n_m_2 is turned on (see FIG. 8B). Thus, data writing is completed.

The transistor of the memory cell MC_n_m_2 is turned off (see FIG. 8C), whereby the data is held. At that time, a potential difference between the electrodes of the capacitor of the memory cell MC_n_m_2 is +0.5 V or −0.5 V depending on the data.

Next, a method for reading data is described with reference to FIGS. 9A to 9C. First, the precharge transistor PTr_n_m is turned on, and the potential of the sub bit line SBL_n_m is set to +0.5 V. After that the precharge transistor PTr_n_m is turned off, so that the sub bit line SBL_n_m is made in a floating state. Further, the potential of the bit line BL_m is set to +0.5 V.

Next, the transistor of the memory cell MC_n_m_2 is turned on. As a result, the potential of the sub bit line SBL_n_m is either +0.4 V or +0.6 V depending on the written data (see FIG. 9A).

Here, if the inverter INV_n_m outputs +0.9 V and +0.1 V in the case where the potentials of the inputs are +0.4 V and +0.6 V, respectively, the inverter INV_n_m outputs +0.9 V or +0.1 V depending on the written data.

After that, the transistor of the memory cell MC_n_m_2 is turned off, and the reading transistor RTr_n_m is turned on. As a result, the potential of the bit line BL_m becomes +0.9 V or +0.1 V depending on the data (see FIG. 9B).

Because the bit of data written in the memory cell MC_n_m_2 is corrupted in this operation, data is written again. At that time, the reading transistor RTr_n_m is turned off and the precharge transistor PTr_n_m is turned on.

After that, the potential difference between the bit line BL_m and a reference potential (+0.5 V) is amplified. The potential of the bit line BL_m becomes +1 V or 0 V depending on the data. Then, the transistor of the memory cell MC_n_m_2 is turned on, so that the bit of data can be written in the memory cell MC_n_m_2 (see FIG. 9C).

Next, a method for reading data using one n-channel transistor NMOS as illustrated in FIG. 7B, as an amplifier circuit, is described with reference to FIGS. 10A to 10C. The potential of the source of the n-channel transistor NMOS is set to 0 V.

First, the precharge transistor PTr_n_m is turned on, and the potential of the sub bit line SBL_n_m is set to +0.5 V. After that, the precharge transistor PTr_n_m is turned off, so that the sub bit line SBL_n_m is made in a floating state. Further, the potential of the bit line BL_m is set to +0.5 V (see FIG. 10A).

The transistor of the memory cell MC_n_m_2 is turned on. As a result, the potential of the sub bit line SBL_n_m is either +0.4 V or +0.6 V depending on the written data (see FIG. 10B).

Here, the threshold voltage of the n-channel transistor NMOS is set to +0.5 V. If the potential of the gate of the n-channel transistor NMOS (i.e., the potential of the sub bit line SBL_n_m) is +0.4 V, the n-channel transistor NMOS is turned off; however, if the potential of the gate of the n-channel transistor NMOS (i.e., the potential of the sub bit line SBL_n_m) is +0.6 V, the n-channel transistor NMOS is turned on.

After that, the transistor of the memory cell MC_n_m_2 is turned off, the potential of the bit line BL_m is set to +1 V, and then the bit line BL_m is made in a floating state. Further, the reading transistor RTr_n_m is turned on.

In the case where the potential of the sub bit line BL_n_m is +0.4 V, the potential of the bit line BL_m hardly changes (the potential remains at +1 V) after a predetermined time passes since the n-channel transistor NMOS is in an off state. On the other hand, in the case where the potential of the sub bit line BL_n_m is +0.6 V, the potential of the bit line BL_m is reduced to 0 V and becomes +0.1 V (or less) after a predetermined time passes since the n-channel transistor NMOS is in an on state. That is, the potential of the bit line BL_m becomes +1 V or +0.1 V depending on the data (see FIG. 10C).

In the semiconductor memory circuit illustrated in FIG. 7B, data can be read by a method other than the method described above. The method for reading data is described with reference to FIGS. 11A to 11C. In this method, the potential of the sub bit line SBL_n_m in data reading is precharged to +1 V, which is 0.5V higher than the potential in data writing. Further, the potential of the bit line BL_m is set to +1 V (see FIG. 11A).

After that the precharge transistor PTr_n_m is turned off, so that the sub bit line SBL_n_m is made in a floating state. At that time, the potential of the source of the transistor of the memory cell MC_n_m_2 is +1.5 V or +0.5 V depending on the data.

Next, the transistor of the memory cell MC_n_m_2 is turned on. The potential of the bit line BL_m is +1 V as described above; accordingly, electric charges flow into or leak out of the capacitor. As a result, the potential of the sub bit line SBL_n_m becomes +0.9 V or +1.1 V depending on the written data (see FIG. 11B).

After that the potential of the bit line is set to 0 V and the bit line is made in a floating state. Further, the reading transistor RTr_n_m is turned on. The threshold voltage of the n-channel transistor NMOS_n_m whose gate is connected to the sub bit line SBL_n_m is +0.5 V, and the potential of the source is +1 V.

The potential of the bit line BL_m increases since the potential (+1 V) of the source of the n-channel transistor NMOS_n_m is higher than the potential (0V) of the bit line BL_m; however, it does not increase to the potential higher than or equal to the potential obtained by subtracting the threshold voltage from the potential of the gate of the n-channel transistor NMOS_n_m.

That is, in the case where the potential of the sub bit line SBL_n_m is +1.1 V, the potential of the bit line BL_m increases to +0.6 V; however, in the case where the potential of the sub bit line SBL_n_m is +0.9 V, the potential of the bit line BL_m remains at less than or equal to +0.4 V (see FIG. 11C). That is, the potential difference between the sub bit line SBL_n_m and the source of the n-channel transistor NMOS_n_m can be transferred to the bit line BL_m.

The potential difference between the potential of the bit line and the reference potential (+0.5 V) is amplified, whereby the data can be read. Note that the phase of the potential of the bit line BL_m is opposite to that of the written data. Thus, it is preferable that writing the potential as it is to the memory cell be avoided.

An inverter may be provided between the n-channel transistor NMOS_n_m and the reading transistor RTr_n_m so as to output high current to the bit line BL_m by further inverting the phase of an output potential of the n-channel transistor NMOS_n_m and amplifying the potential.

Lastly, a method for reading data, in which one n-channel transistor is used as the amplifier illustrated in FIG. 7C and a reading transistor is not used, is described with reference to FIGS. 12A to 12C. Also in this method, the potential of the sub bit line SBL_n_m is made +0.5 V higher than the potential in data writing, and the sub bit line SBL is precharged to +1 V. Further, the potential of the bit line BL_m and the potential of the source of the n-channel transistor NMOS_n_m are each set to +1 V (see FIG. 12A).

The threshold voltage of the NMOS_n_m is +0.5 V, and the gate, the source, and the drain of the NMOS_n_m are at the same potential; thus, the NMOS_n_m is in an off state.

After that the precharge transistor PTr_n_m is turned off, so that the sub bit line SBL_n_m is made in a floating state. Next, the transistor of the memory cell MC_n_m_2 is turned on. The potential of the sub bit line SBL_n_m becomes +0.9 V or +1.1 V depending on the written data (see FIG. 12B). Also at this time, the potential difference between the gate and the source of the n-channel transistor NMOS_n_m or between the gate and the drain of the n-channel transistor NMOS_n_m is less than or equal to the threshold voltage; therefore, the n-channel transistor NMOS_n_m is in an off state.

After that, the potential of the bit line BL_m is decreased to 0V. However, by the decrease in the potential of the bit line BL_m, the n-channel transistor NMOS_n_m is turned on, so that current flows from the source of the n-channel transistor NMOS_n_m to the bit line BL_m and the decrease in the potential of the bit line BL_m is stopped.

Figure 12C:
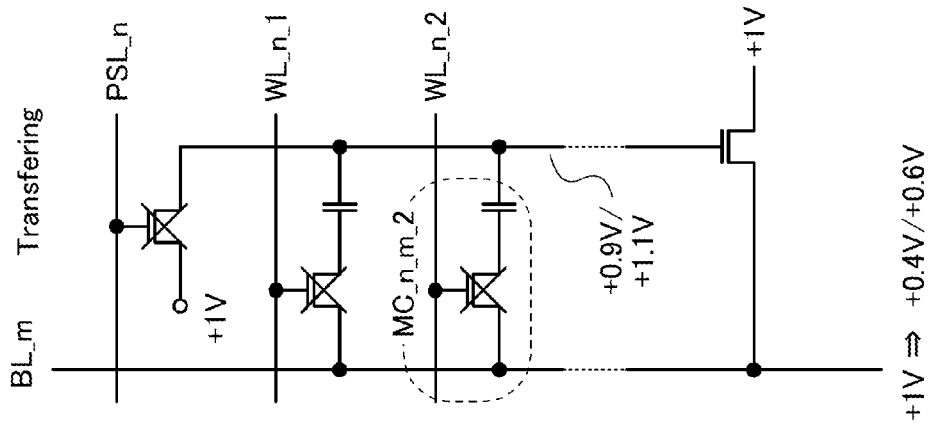
FIGS. 12A to 12C are diagrams illustrating an example of a method for driving a semiconductor memory device of the present invention.
Figure 12B:
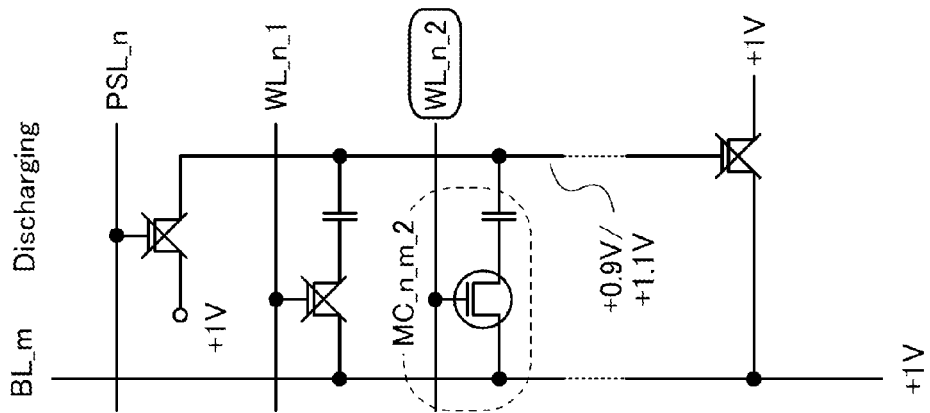
Figure 12A:
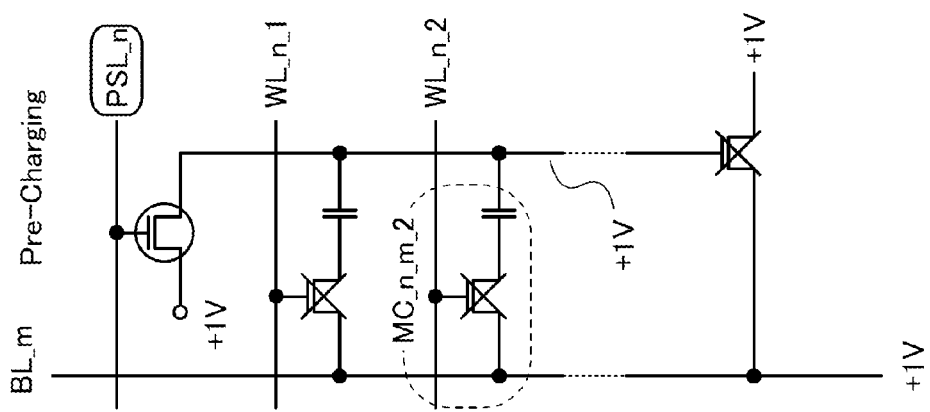

That is, the potential of the bit line BL_m is decreased to +0.4 V when the potential of the sub bit line SBL_n_m is +0.9 V; on the other hand, the potential of the bit line BL_m remains at higher than or equal to +0.6 V when the sub bit line SBL_n_m is +1.1 V (see FIG. 12C).

The potential difference between the bit line BL_m and the reference potential (+0.5 V) is amplified, whereby the data can be read. Note that the phase of the potential of the bit line BL_m is opposite to that of the written data. Thus, writing the amplified potential as it is to the memory cell should be avoided.

In the above examples, the potential difference between the sub bit line SBL_n_m and the reference potential is amplified or transferred, so that a potential corresponding thereto is output to the bit line BL_m. That is, electric charges are accumulated in the bit line BL_m, which is effective in reducing effects of noise. In the above example, the potential of the sub bit line SBL_n_m is described as being stable; however, in reality, the potential thereof changes irregularly.

Specifically, in the case where the sum of the capacitance of the sub bit line SBL_n_m and the capacitance of one capacitor is less than 10 fF, a potential change due to noise is large, and an error is likely to occur when a small potential difference between sub bit lines each with low capacitance is amplified by a flip-flop circuit or the like.

However, such noise content is supposed to be canceled by time average. From that viewpoint, when electric charges corresponding to the potential of SBL_n_m (that is greatly affected by noise) is accumulated in the bit line BL_m (that has high capacitance and is hardly affected by noise), the potential of the bit line BL_m mostly reflects the average value of the potential of the sub bit line SBL_n_m.

Accordingly, a method for reading data as described in this embodiment is suitable for a semiconductor memory device in which the capacitance of a sub bit line is extremely low, that is, the capacitance of a capacitor of a memory element is extremely low.

Embodiment 2

Examples of methods for writing data and reading data in the case of using the memory block illustrated in FIG. 5B as the memory block MB_n_m and the inverter illustrated in FIG. 7A as the amplifier circuit AMP_n_m are described with reference to FIGS. 13A to 13C and FIGS. 14A to 14C. Note that the semiconductor memory device having such a circuit configuration can operate using a method other than the methods described below.

First, a method for writing data is described with reference to FIGS. 13A to 13C. Note that the method for writing data can be conducted regardless of the kind of the amplifier circuit. Here, an example is given in which one bit of data is written into the memory cell MC_n_m_2. In this embodiment, the capacitance of the sub bit line SBL_n_m is four times as high as the capacitance of the capacitor of the memory cell.

First, the potential of the bit line BL_m is set to +0.5 V, and the precharge transistor PTr_n_m is turned on, so that the potential of the sub bit line SBL_n_m becomes +0.5 V. Further, the transistor of the memory cell MC_n_m_2 is turned on (see FIG. 13A).

Next, the precharge transistor PTr_n_m is turned off, so that the sub bit line SBL_n_m becomes a floating state. After that, the potential of the bit line BL_m is set to a potential corresponding to one bit of data (here, +1 V or 0 V). At that time, since the sub bit line SBL_n_m is in a floating state, the potential of the sub bit line SBL_n_m becomes +0.6 V or +0.4 V depending on the written data (see FIG. 13B). Thus, data writing is completed.

The transistor of the memory cell MC_n_m_2 is turned off (see FIG. 13C), whereby the data is held. At that time, a potential difference between electrodes of the capacitor of the memory cell MC_n_m_2 is +0.4 V or −0.4 V depending on the data.

Next, a method for reading data is described with reference to FIGS. 14A to 14C. First, the potential of the bit line BL_m is set to +0.5 V, and the precharge transistor PTr_n_m is turned on, so that the potential of the sub bit line SBL_n_m becomes +0.5 V. At that time, the potential difference between the electrodes of the capacitor of the memory cell MC_n_m_2 is held; thus, the potential of the source of the transistor of the memory cell MC_n_m_2 becomes +0.9 V or +0.1 V depending on the written data (see FIG. 14A).

After that the precharge transistor PTr_n_m is turned off, so that the sub bit line SBL_n_m is made in a floating state. Next, the transistor of the memory cell MC_n_m_2 is turned on. As a result, the potential of the sub bit line SBL_n_m becomes +0.42 V or 0.58 V depending on the written data (see FIG. 14B).

Here, if the inverter INV_n_m is set to output +0.8 V and +0.2 V in the case where the potentials of the inputs are +0.42 V and +0.58 V, respectively, the inverter INV_n_m outputs +0.8 V or +0.2 V depending on the written data.

Subsequently, the transistor of the memory cell MC_n_m_2 is turned off, and the reading transistor RTr_n_m is turned on. As a result, the potential of the bit line BL_m becomes either +0.8 V or +0.2 V depending on the data (see FIG. 14C). After that, a potential difference between the bit line BL_m and a reference potential (+0.5 V) is amplified, whereby the potential of the bit line BL_m becomes either +1 V or 0 V depending on the data.

In the case of using the circuit illustrated in FIG. 7B or 7C as the amplifier circuit, Embodiment 1 can be referred to.

Embodiment 3

Examples of methods for writing data and reading data in the case of using the memory block illustrated in FIG. 6A as the memory block MB_n_m and the inverter illustrated in FIG. 7A as the amplifier circuit AMP_n_m included in a semiconductor memory device are described with reference to FIGS. 15A to 15C and FIGS. 16A to 16C. Note that the semiconductor memory device having such a circuit configuration can operate using a method other than the methods described below.

First, a method for writing data is described with reference to FIGS. 15A to 15C. Note that the method for writing data can be conducted regardless of the kind of the amplifier circuit. Here, an example is given in which one bit of data is written into the memory cell MC_n_m_2. In this embodiment, the capacitance of the sub bit line SBL_n_m is four times as high as the capacitance of the capacitor of the memory cell.

Figure 15A:
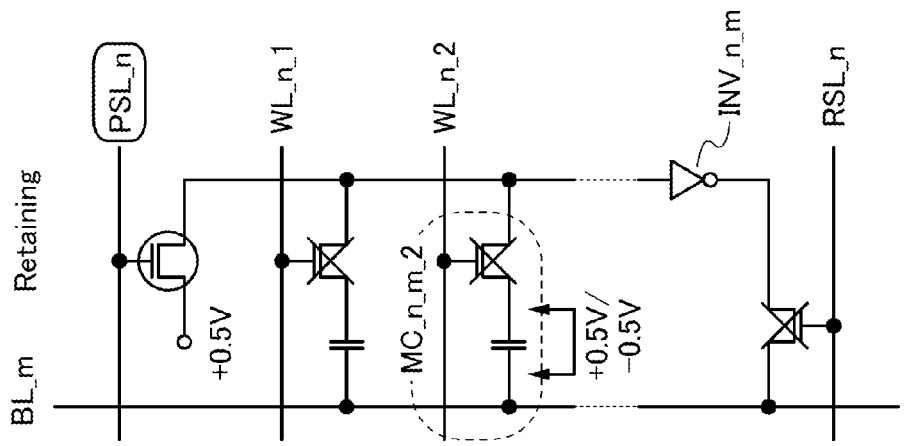
FIGS. 15A to 15C are diagrams illustrating an example of a method for driving a semiconductor memory device of the present invention.

First, the potential of the sub bit line SBL_n_m is precharged to +0.5 V (see FIG. 15A).

Figure 15B:
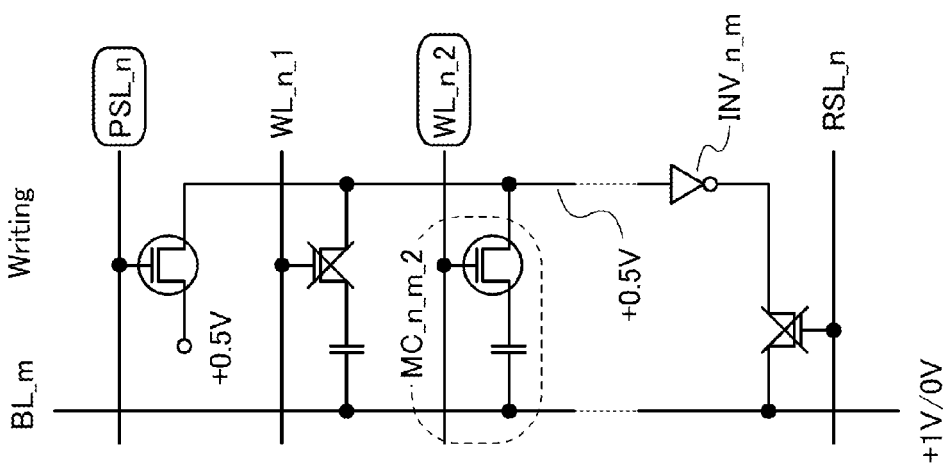
Figure 15C:
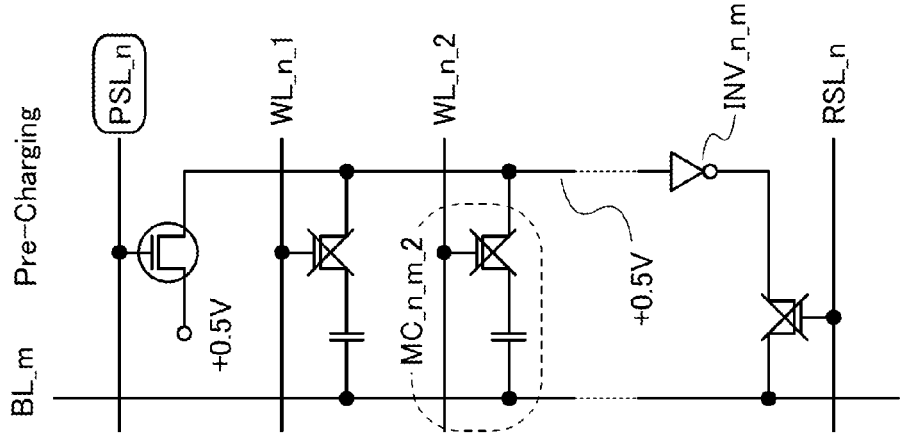

Next, the potential of the bit line BL_m is set to a potential corresponding to one bit of data (here, +1 V or 0 V), and the transistor of the memory cell MC_n_m_2 is turned on (see FIG. 15B). Thus, data writing is completed.

The transistor of the memory cell MC_n_m_2 is turned off (see FIG. 15C), whereby the data is held. At that time, a potential difference between the electrodes of the capacitor of the memory cell MC_n_m_2 is +0.5 V or −0.5 V depending on the data.

Figure 16A:
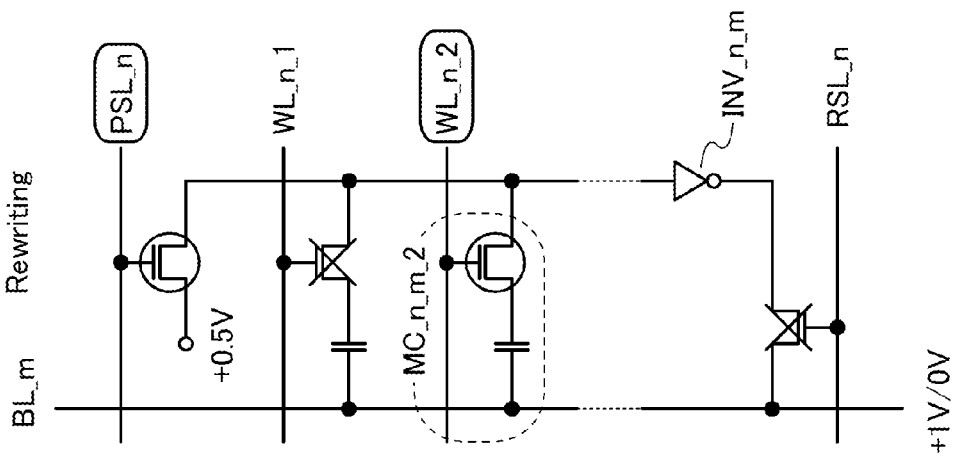
FIGS. 16A to 16C are diagrams illustrating an example of a method for driving a semiconductor memory device of the present invention.
Figure 16B:
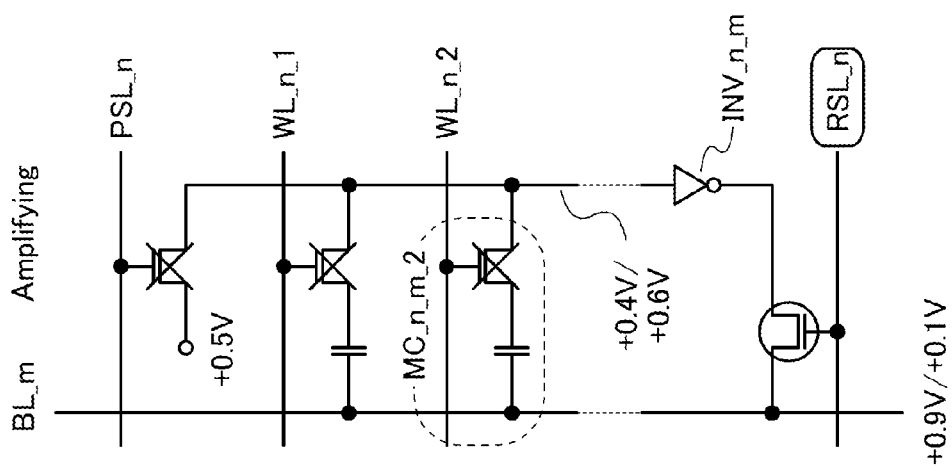
Figure 16C:
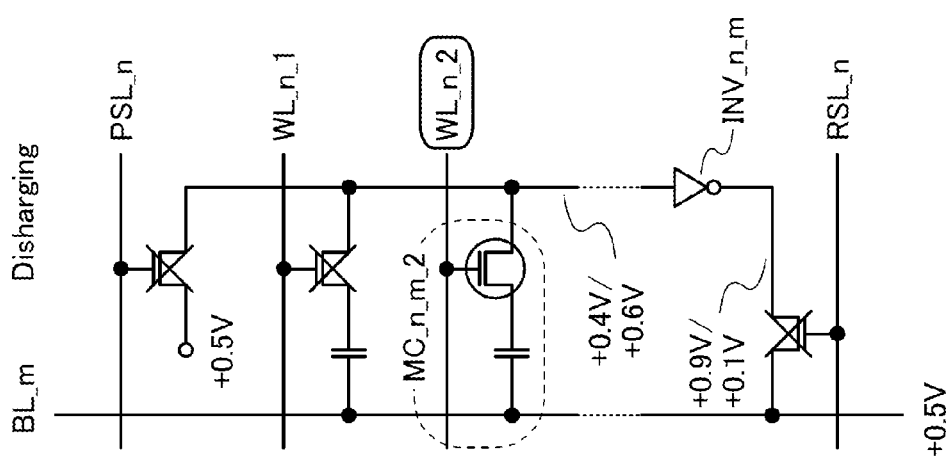

Next, a method for reading data is described with reference to FIGS. 16A to 16C. First, the potential of the bit line BL_m is set to +0.5 V, and the potential of the sub bit line SBL_n_m is set to +0.5 V. After that the sub bit line SBL_n_m is made in a floating state, and the transistor of the memory cell MC_n_m_2 is turned on. Accordingly, the potential of the sub bit line SBL_n_m becomes +0.4 V or +0.6 V depending on the written data (see FIG. 16A).

When the transistor of the memory cell MC_n_m_2 is on, the potential of the sub bit line SBL_n_m is affected by the potential of a word line through the gate capacitance of the transistor of the memory cell MC_n_m_2. In other words, the potential of the sub bit line SBL_n_m increases if the transistor of the memory cell MC_n_m_2 is an n-channel transistor and decreases if the transistor of the memory cell MC_n_m_2 is a p-channel transistor.

It is needless to say that the potential change of the sub bit line can be ignored in the case where the gate capacitance is sufficiently lower than that of the capacitor. In this embodiment, such a potential of the word line given to the sub bit line SBL_n_m through the gate capacitance is ignored.

In order to avoid the potential change of the sub bit line SBL_n_m caused by the gate capacitance, the transistor of the memory cell MC_n_m_2 is preferably turned off before the reading transistor RTr_n_m is turned on. Note that in the memory block in either FIG. 5A or 5B, the potential of the sub bit line SBL_n_m is not affected by the potential of the word line even in the case where the transistor of the memory cell MC_n_m_2 is turned on.

After that, the transistor of the memory cell MC_n_m_2 is turned off, and the reading transistor RTr_n_m is turned on. Here, if the inverter INV_n_m is set to output +0.9 V and +0.1 V in the case where the potentials of the inputs are +0.4 V and +0.6 V, respectively, the inverter INV_n_m outputs +0.9 V or +0.1 V depending on the data. Accordingly, the potential of the bit line BL_m becomes +0.9 V or +0.1 V depending on the data (see FIG. 16B).

After that, the potential difference between the bit line BL_m and the reference potential (+0.5 V) is amplified, whereby the potential of the bit line BL_m becomes +1 V or 0 V depending on the data. After that, the precharge transistor PTr_n_m is turned on, so that the potential of the sub bit line SBL_n_m is set to +0.5 V. Subsequently, the transistor of the memory cell MC_n_m_2 is turned on, so that one bit of data can be written into the memory cell_n_m_2 (see FIG. 16C).

In the case of using the circuit illustrated in FIG. 7B or 7C as the amplifier circuit, Embodiment 1 can be referred to. Further, in the case of using the circuit illustrated in FIG. 6B as a memory block, Embodiment 2 can be referred to.

Embodiment 4

Figure 2:
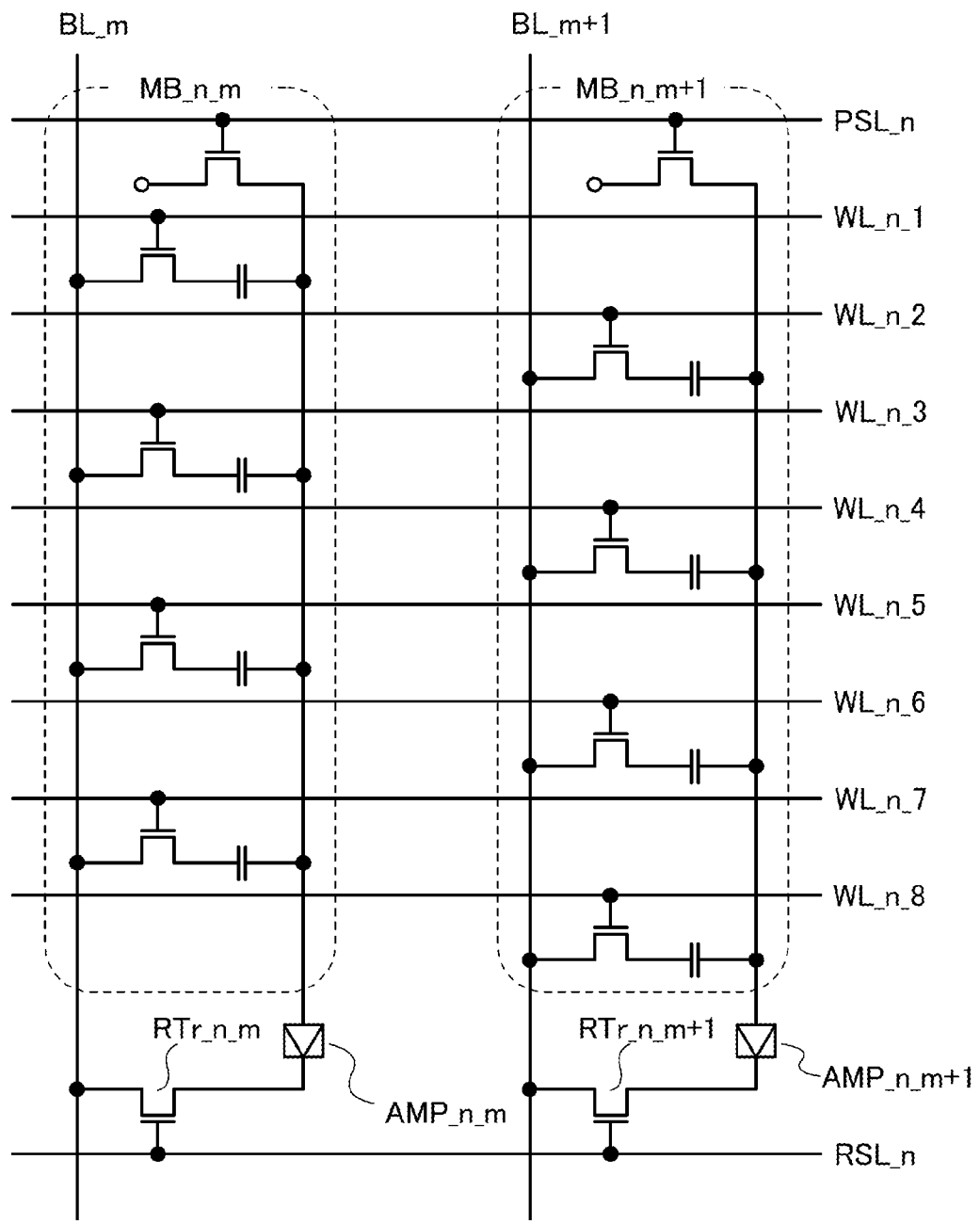
FIG. 2 is a diagram illustrating an example of a circuit of a semiconductor memory device of the present invention.
Figure 3A:
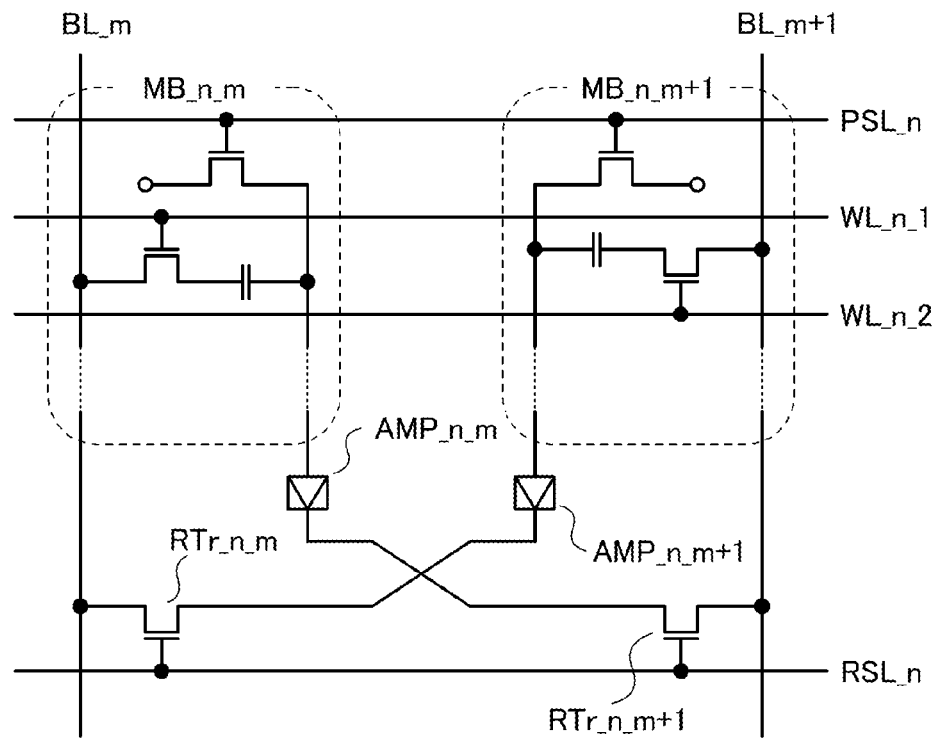
FIGS. 3A and 3B are diagrams each illustrating an example of a circuit of a semiconductor memory device of the present invention.
Figure 3B:
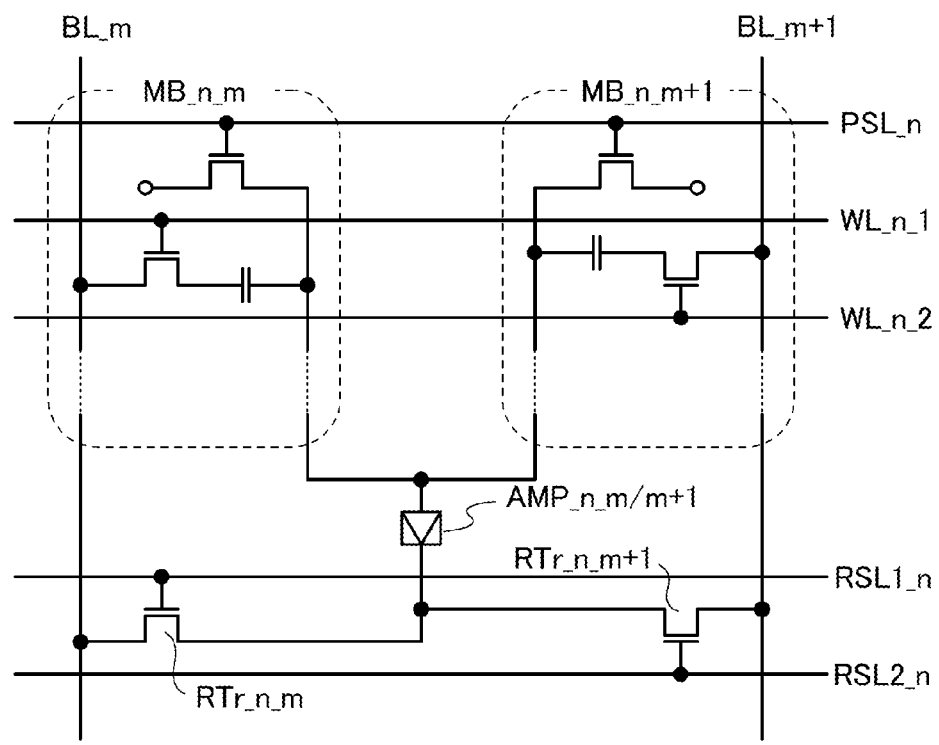

FIG. 2 and FIGS. 3A and 3B each illustrates a semiconductor memory device of this embodiment. FIG. 2 illustrates a memory block MB_n_m, a memory block MB_n_m+1, a bit line BL_m, a bit line BL_m+1, a precharge selection line PSL_n, and a word line WL_n_1 to a word line WL_n_8. The bit line BL_m, the bit line BL_m+1, the precharge selection line PSL_n, and the word line WL_n_1 to the word line WL_n_8 are connected to the memory blocks MB.

Further, FIG. 2 illustrates a reading transistor RTr_n_m, a reading transistor RTr_n_m+1, an amplifier circuit AMP_n_m, and an amplifier circuit AMP_n_m+1. The reading transistor RTr_n_m and the reading transistor RTr_n_m+1 are controlled by a reading selection line RSL_n.

In FIG. 2, the circuit illustrated FIG. 5A is used for the memory block MB; however, any circuit illustrated in FIG. 5B, 6A, or 6B may be used. Further, any circuit illustrated in FIG. 7A, 7B, or 7C may be used for the amplifier circuit AMP.

Note that in the semiconductor memory device of this embodiment, one word line WL is connected to a memory cell of either one of two adjacent memory blocks, the memory block MB_n_m and the memory block MB_n_m+1.

For that reason, when the word line WL_n_1 is selected in reading data, for example, only one memory cell in the memory block MB_n_m is activated (becomes a selecting state), and one bit of data is output only to the bit line BL_m. The potential of the bit line BL_m+1 does not change by the selection of the word line WL_n_1; thus, the data can be read by the by comparison between the potential of the bit line BL_m and the potential of the bit line BL_m+1.

In the semiconductor memory device in FIG. 3A, the memory block is similar to that in FIG. 2; however the connection of the amplifier circuit is different. That is, the output terminal of the amplifier circuit AMP_n_m is connected to the bit line BL_m+1 through the reading transistor RTr_n_m+1, and the output terminal of the amplifier circuit AMP_n_m+1 is connected to the bit line BL_m through the reading transistor RTr_n_m.

Further, in the semiconductor memory device in FIG. 3B, the memory block is similar to that in FIG. 2. However, in FIG. 3B, the semiconductor memory device has a structure in which an output terminal of an amplifier circuit AMP_n_m/m+1 is connected to the bit line BL_m and the bit line BL_m+1 through the reading transistor RTr_n_m and the reading transistor RTr_n_m+1, respectively.

The reading transistor RTr_n_m and the reading transistor RTr_n_m+1 are controlled by a first reading selection line RSL1_n and a second reading selection line RSL2_n, respectively, and a signal by which only one of the reading transistor RTr_n_m and the reading transistor RTr_n_m+1 is turned on or a signal by which both the reading transistor RTr_n_m and the reading transistor RTr_n_m+1 are turned off is supplied to each of the first reading selection line RSL1_n and the second reading selection line RSL2_n.

Embodiments 1 to 3 can be referred to for detail of a method for driving the semiconductor memory devices illustrated in FIG. 2 and FIGS. 3A and 3B.

Embodiment 5

Figure 4C:
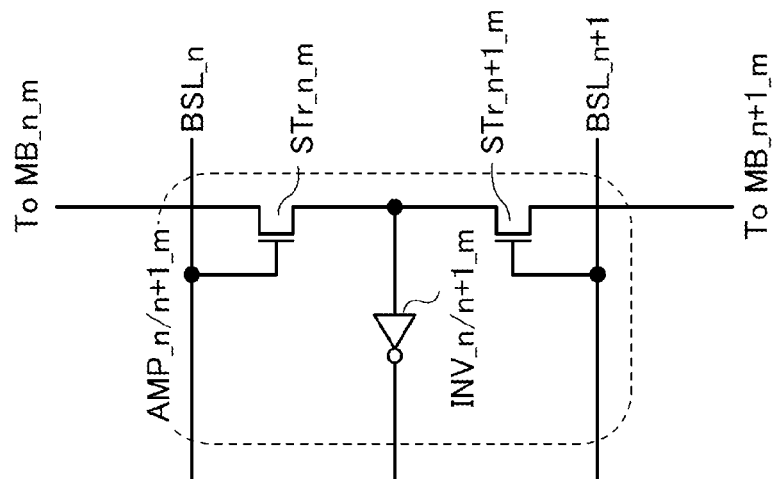
FIGS. 4A to 4C are diagrams each illustrating an example of a circuit of a semiconductor memory device of the present invention.
Figure 4B:
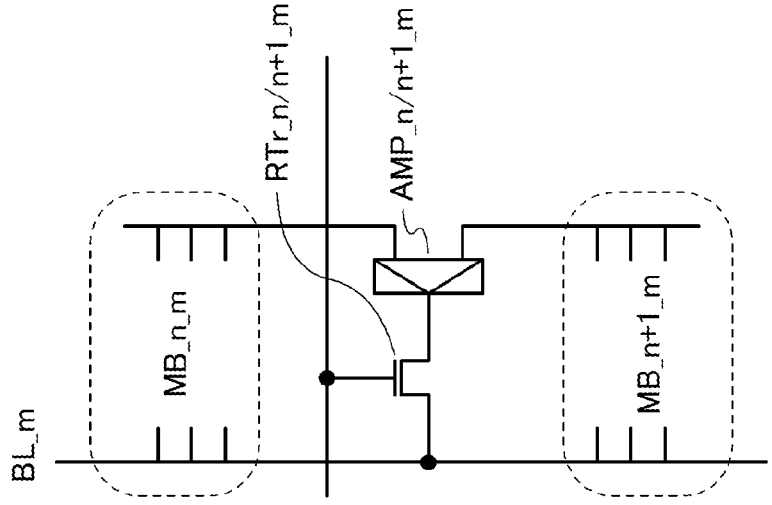
Figure 4A:
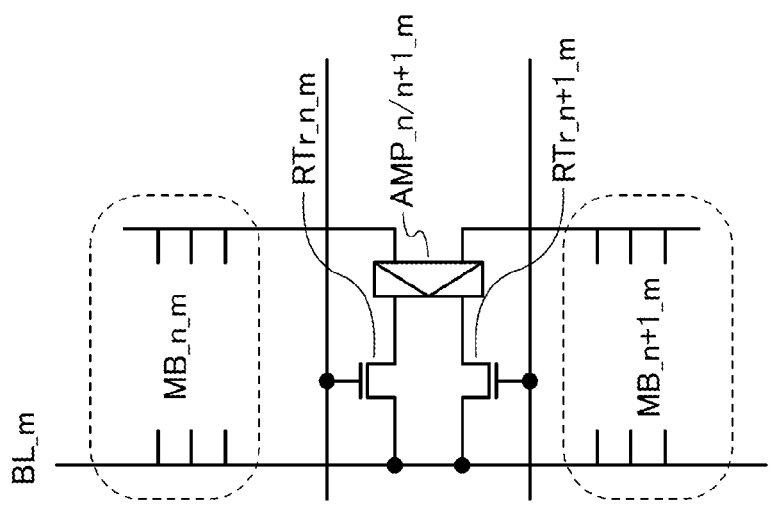

FIGS. 4A to 4C each illustrate a semiconductor memory device of this embodiment. The semiconductor memory device illustrated in FIG. 4A includes an amplifier circuit AMP_n/n+1_m two input terminals of which are connected to sub bit lines of the memory block MB_n_m and the memory block MB_n+1_m. Two output terminals of the amplifier circuit AMP_n/n+1_m are connected to the bit line BL_m through the reading transistor RTr_n_m and the reading transistor RTr_n+1_m.

If the amplifier circuit AMP_n/n+1_m has one output terminal, the output terminal of the amplifier circuit AMP_n/n+1_m may be connected to the bit line BL_m through the reading transistor RTr_n/n+1_m as illustrated in FIG. 4B.

As an example of the amplifier circuit AMP_n/n+1_m illustrated in FIG. 4B, a circuit in which switching elements such as a transistor and an amplifier means including an inverter are combined is given as illustrated in FIG. 4C.

In the circuit illustrated in FIG. 4C, the sub bit lines of the memory blocks MB_n_m and MB_n+1_m are connected to an inverter INV_n/n+1_m through selection transistors STr_n_m and STr_n+1_m, respectively.

The selection transistors STr_n_m and STr_n+1_m are controlled by memory block selection lines BSL_n and BSL_n+1, respectively. Either one of the selection transistors STr_n_m and STr_n+1_m is turned on, whereby the potential of the sub bit line connected to the either one of the selection transistors STr_n_m and STr_n+1_m can be input to the inverter INV_n/n+1_m.

Embodiment 6

FIG. 17A illustrates a semiconductor memory device of this embodiment. The semiconductor memory device of this embodiment includes a first inverter for reading the potential of a sub bit line to a bit line, a second inverter for inverting the potential of the bit line to be supplied to the sub bit line, and one or more switching elements for connecting the first inverter and the second inverter to the bit line or the sub bit line. For the memory block MB included in the semiconductor memory device in FIG. 17A, any memory block MB illustrated in FIG. 5A, 5B, 6A or 6B may be used.

The circuit illustrated in FIG. 17A is a variation of the circuit illustrated in FIG. 7A, in which the bit line BL_m is connected to an input terminal of the second inverter INV2_n_m, an output terminal of the second inverter INV2_n_m is connected to a drain of a writing transistor WTr_n_m, and a source of the writing transistor WTr_n_m is connected to an input terminal of the first inverter INV_n_m. The writing transistor WTr_n_m is controlled by a writing selection line WSL_n.

The degree of integration is decreased by provision of a plurality of inverters with one memory block as described above. By the method similar to that illustrated in FIG. 4C, the circuit illustrated in FIG. 17A may be shared with two or more memory blocks.

In the circuit illustrated in FIG. 17A, one bit of data of a memory cell in the memory block MB_n_m is read as follows.

First, the sub bit line SBL_n_m is precharged to a reference potential. Next, the sub bit line SBL_n_m is made in a floating state, a transistor of the memory cell is turned on, and electric charges accumulated in a capacitor are released to the sub bit line SBL_n_m. The potential of the sub bit line SBL_n_m changes from the reference potential, and the potential difference from the reference potential is inverted and amplified by the inverter INV_n_m, thereby output to the bit line BL_m through the reading transistor RTr_n_m. The steps up to here are the same as those described in Embodiment 1.

After that, data is written in the memory cell where the bit of data has been lost. At that time, the second inverter INV2_n_m is activated (i.e., in the state where power is supplied to the inverter), and the writing transistor WTr_n_m is turned on. Accordingly, a flip-flop circuit is formed and the potential is amplified. Further, the potentials of the bit line BL_m and the sub bit line SBL_n_m have opposite phases to each other.

After the amplification is completed, the reading transistor RTr_n_m is turned off. At that time, the flip-flop circuit is broken; however, at least the second inverter INV2_n_m needs to be kept in active state. Next, the transistor of the memory cell is turned on. If data does not need to be rewritten, the original data is written in the memory cell.

If the data needs to be rewritten, the potential of the bit line BL_m is set to a potential corresponding to data to be written. Since the flip-flop circuit has been broken, current high enough to charge the bit line BL_m is supplied. The potential of the bit line BL_m is inverted by the second inverter INV2_n_m, and the potentials of the sub bit line SBL_n_m and bit line BL_m have opposite phases to each other. The transistor of the memory cell is turned off, whereby the data is held.

In the semiconductor memory device of this embodiment, a potential difference between electrodes of the capacitor of the memory cell in writing data can be larger than that in Embodiment 1, and can be twice as large as that in Embodiment 1. Therefore, the potential change of the sub bit line in reading data can be larger, and probability of error occurrence in reading data can be reduced.

Embodiment 7

FIG. 17B illustrates a semiconductor memory device of this embodiment. The semiconductor memory device of this embodiment includes, as one amplifier circuit, two inverters and two switching elements for changing a circuit configuration, and two memory blocks share the amplifier circuit. Thus, one memory block includes one inverter and one switching element in practice.

For the memory block MB used in the semiconductor memory device in FIG. 17B, any memory block MB used in FIG. 5A, 5B, 6A, or 6B may be used. Note that in the case where the circuit illustrated in FIG. 17B is used, it is not necessary to provide a precharge transistor for the memory block. This is because the reading transistor RTr_n_m can be used to precharge the memory block MB_n_m as described later.

In the circuit illustrated in FIG. 17B, the sub bit line SBL_n_m of the memory block MB_n_m is connected to an input terminal of the inverter INV_n_m, a source of the writing transistor WTr_n_m, and a source of the reading transistor RTr_n_m. Further, a sub bit line SBL_n+1_m of the memory block MB_n+1_m is connected to the input terminal of the inverter INV_n+1_m, a source of the writing transistor WTr_n+1_m, and a source of a reading transistor RTr_n+1_m.

Further, a drain of the writing transistor WTr_n_m is connected to an output terminal of the inverter INV_n+1_m and a drain of the writing transistor WTr_n+1_m is connected to an output terminal of the inverter INV_n_m. Further, a drain of the reading transistor RTr_n_m and a drain of the reading transistor RTr_n+1_m are connected to the bit line BL_m.

The writing transistors WTr_n_m and WTr_n+1_m are controlled by writing selection lines WSL_n and WSL_n+1, respectively. Further, the reading transistors RTr_n_m and RTr_n+1_m are controlled by reading selection lines RSL1_n and RSL1_n+1, respectively.

Examples of a method for driving a semiconductor memory device having such a circuit are described with reference to FIGS. 18A to 18C and FIGS. 19A to 19C.

⟨1. Precharge⟩

First, in order to precharge the sub bit line SBL_n_m to the reference potential, +0.5 V, the potential of the bit line BL_m is set to +0.5 V, and then the reading transistor RTr_n_m is turned on (see FIG. 18A).

At that time, the inverter INV_n_m and the inverter INV_n+1_m may be either active or inactive. Further, the writing transistors WTr_n_m and WTr_n+1_m may be turned either on or off.

⟨2. Discharge of Capacitor of Memory Cell⟩

Next, the reading transistor RTr_n_m is turned off, so that the sub bit line SBL_n_m becomes a floating state. Then, the transistor of a memory cell is turned on. Here, the potential of the sub bit line SBL_n_m is +0.4 V. Further the inverter INV_n_m is activated. The inverter INV_n_m outputs the potential corresponding to the input potential; here, the output potential is +0.9 V (see FIG. 18B).

⟨3. Amplification⟩

After that, the transistor of the memory cell is turned off, and then the reading transistor RTr_n+1_m is turned on. At that time, the writing transistor WTr_n+1_m needs to be in an on state. Accordingly, the potential of the bit line BL_m is raised from +0.5 V (see FIG. 18C). After the potential of the bit line BL_m is raised to some extent, a sense amplifier (not illustrated) connected to the bit line BL_m is operated and a potential difference between the bit line BL_m and a reference potential may be amplified.

⟨4. Data Reading⟩

Further, the writing transistor WTr_n_m is turned on, and the inverter INV_n+1_m is activated. Accordingly, a flip-flop circuit is formed, and the potential difference between the bit line BL_m and the reference potential is further amplified. Thus, the potential of the bit line BL_m becomes +1 V and the potential of the sub bit line SBL_n_m becomes 0 V. By reading the potential of the bit line BL_m, reading of one bit of data is completed (see FIG. 19A).

⟨5. Data Restoring⟩

Subsequently, the writing transistor WTr_n+1_m is turned off. As a result, the flip-flop circuit is broken; however, at least the second inverter INV_n+1_m needs to be kept active. The transistor of the memory cell is turned on. If the data does not need to be rewritten, the original data is written in the memory cell (see FIG. 19B).

⟨6. Data Rewriting⟩

If it is necessary to write different data (rewrite data), the potential of the bit line BL_m is set to a potential corresponding to data to be rewritten (here, 0 V). The flip-flop circuit has already been broken; thus, current high enough to charge the bit line BL_m is supplied. The potential of the bit line BL_m is inverted by the inverter INV_n+1_m, and the potential of the sub bit line SBL_n_m becomes +1 V. Data that is different from the data that has been stored in the memory cell is written (see FIG. 19C). The transistor of the memory cell is turned off, whereby the data is held.

In the above, an example in which data in one memory cell is read and then data in the same memory cell is rewritten is described; however, only rewriting data without reading the data can be performed.

As in Embodiment 6, in this embodiment, the absolute value of the potential difference between the bit line BL_m and the sub bit line SBL_n_m is 1 V in data writing. In contrast, in the example described in Embodiment 1, the absolute value of the potential difference between the bit line BL_m and the sub bit line SBL_n_m is 0.5 V in data writing. Thus, the potential change of the bit line in reading can be larger by the methods described in this embodiment and Embodiment 6.

Further, in this embodiment, as a first process, electric charges corresponding to the potential of the sub bit line SBL_n_m are accumulated in the bit line BL_m. As described above, this process is effective for avoiding effects of variations in threshold voltages among transistors forming an inverter as well as for leveling the potential of the sub bit line SBL_n_m that is largely affected by noise.

In general, in the case where the potential difference is amplified by a flip-flop circuit, a value of variation in threshold voltages among transistors needs to be less than half of the potential difference between bit lines at an early stage of the amplification. In the above example, the potential difference of 0.1 V is amplified; thus, if the value of variations in the threshold voltages among the transistors is 50 mV, an error occurs.

On the other hand, when an inverter is formed using transistors whose absolute value of the average threshold voltage is 0.4 V and the value of variation in the threshold voltages is 50 mV, the potential of an output of the inverter is lower than +0.5 V in the case where the potential of the sub bit line in reading is +0.6 V that is higher than the reference potential by 0.1 V, and the potential of the output of the inverter is higher than +0.5 V in the case where the potential of the sub bit line is +0.4 V. Therefore, in any case, a malfunction hardly occurs.

The flip-flop circuit is formed at the stage where the potential difference between the bit line BL_m and sub bit line SBL_n+1_m is sufficiently large. At this stage, the flip-flop circuit is not affected by the variations in threshold voltages, resulting in being hardly affected by noise, compared to the case where the potential difference of 0.1 V is simply amplified by the flip-flop circuit.

Embodiment 8

In this embodiment, another method for driving the semiconductor memory device illustrated in FIG. 17B is described with reference to FIGS. 20A to 20C and FIGS. 21A to 21C. Note that in the driving method of this embodiment, the potential difference between sub bit lines is amplified by a flip-flop circuit; thus, the capacitance of a capacitor is preferably 10 fF or more. When the capacitance of the capacitor is 5 fF or less, malfunction easily occurs due to the effects of noise.

Further, as described in Embodiment 7, variations in the threshold voltages among transistors forming an inverter need to be sufficiently small.

⟨ 1. Precharge⟩

First, in order to precharge the sub bit lines SBL_n_m and SBL_n+1_m to the reference potential of +0.5 V, the potential of the bit line BL_m is set to +0.5 V, and then the reading transistors RTr_n_m and RTr_n+1_m are turned on (see FIG. 20A).

At that time, the inverters INV_n_m and INV_n+1_m are not active. Further, the writing transistors WTr_n_m and WTr_n+1_m may be turned either on or off.

⟨ 2. Discharge of Capacitor of Memory Cell⟩

Next, the reading transistors RTr_n_m and RTr_n+1_m are turned off, so that the sub bit lines SBL_n_m and SBL_n+1_m are in a floating state.

Further, the writing transistors WTr_n_m and WTr_n+1_m are turned on, and the transistor of the memory cell is turned on. Here, the potential of the sub bit line SBL_n_m is +0.4 V. On the other hand, the potential of the sub bit line SBL_n+1_m remains at +0.5 V (see FIG. 20B).

⟨ 3. Amplification⟩

After that, the inverters INV_n_m and INV_n+1_m are activated. Accordingly, a flip-flop circuit is formed, and the potential difference between the sub bit lines SBL_n_m and SBL_n+1_m is amplified. Here, the potential of the sub bit line SBL_n+1_m becomes +1 V and the potential of the sub bit line SBL_n_m becomes 0 V (see FIG. 20C).

⟨ 4. Data Reading⟩

Further, the reading transistor RTr_n+1_m is turned on. The potential of the bit line BL_m becomes +1 V. By reading the potential of the bit line BL_m, reading of one bit of data is completed (see FIG. 21A).

⟨ 5. Data Restoring⟩

Subsequently, the writing transistor WTr_n+1_m is turned off. Accordingly, the flip-flop circuit is broken; however, at least the inverter INV_n+1_m needs to be kept active. If data does not need to be rewritten, the original data is written in the memory cell (see FIG. 21B).

⟨ 6. Data Rewriting⟩

If it is necessary to rewrite data, the potential of the bit line BL_m is set to a potential corresponding to data to be rewritten (here, 0 V). The flip-flop circuit has already been broken; thus, current high enough to charge the bit line BL_m is supplied. The potential of the bit line BL_m is inverted by inverter INV_n+1_m, and the potential of the sub bit line SBL_n_m becomes +1V. Data that is different from the data that has been stored in the memory cell is written (see FIG. 21C). The transistor of the memory cell is turned off, whereby the data is held.

In the above, an example in which data in one memory cell is read and then data in the same memory cell is rewritten is described); however, only rewriting data without reading the data can be performed.

Also in this embodiment, the absolute value of the potential difference between the bit line BL_m and the sub bit line SBL_n_m is 1 V in data writing. Further, unlike in Embodiment 7, the transistor of the memory cell is turned on during reading and writing data; thus, the potential change of a word line can be suppressed and power consumption can be reduced.

In the above example, although the sub bit line SBL_n+1_m is electrically insulated from the bit line BL_m in the process of ⟨ 3. Amplification⟩, amplification may be performed while these lines are connected to each other. In general, the capacitance of the bit line BL_m is sufficiently higher than that of the sub bit line SBL_n_m. Thus, even in the case where the inverters INV_n_m and INV_n+1_m form a flip-flop circuit in appearance, such a flip-flop circuit can be considered as a circuit where inverters are just connected in a short time such as in a data reading period.

For example, when the potential of the sub bit line SBL_n_m becomes temporarily an unintended value (e.g., +0.6 V) due to noise although it is supposed to be +0.4 V, the inverter INV_n_m outputs electric charges corresponding to the unintended value and tends to reduce the potential of the output terminal.

If the capacitance connected to the output terminal of the inverter INV_n_m is just the capacitance of the sub bit line SBL_n+1_m, the potential of the output terminal of the inverter INV_n_m is rapidly decreased; thus, the inverter INV_n+1_m outputs a corresponding electric charges to the sub bit line SBL_n_m and the increase of the potential of the sub bit line SBL_n_m is reinforced.

However, since the capacitance connected to the output terminal of the inverter INV_n_m (the total capacitance of the bit line BL_m and the sub bit line SBL_n+1_m) is sufficiently high, the potential change of the bit line BL_m is gentle. Accordingly, electric charges output from the inverter INV_n+1_m to the sub bit line SBL_n_m are less affected by the noise, and the potential of the sub bit line SBL_n_m does not rise so high. That is, feedback is limited.

Since the effects of the noise is temporary, the potential of the sub bit line SBL_n_m returns to the proper potential (e.g., +0.4 V) if the potential of the sub bit line SBL_n_m does not rise sufficiently high. Then, the inverter INV_n_m outputs a potential corresponding thereto. The potential change of the output terminal is gradual since the capacitance connected to the output terminal of the inverter INV_n_m is sufficiently high, and a period of time not being affected by the noise is longer than the period of time affected by noise; thus, the sub bit line SBL_n_m has a proper potential and the effect of the noise is significantly reduced.

Further, the capacitance of the sub bit line SBL_n_m is much lower than that of the bit line BL_m. Thus, the potential of the sub bit line SBL_n_m rapidly increases to a potential higher than that of the bit line BL_m, at the level which the potential is hardly affected by the noise.

When such a driving method is employed, an advantageous effect can be achieved when the capacitance of the bit line BL_m is 10 times or more, preferably 30 times or more the capacitance of the sub bit line SBL_n_m. Moreover, under such a condition, the capacitance of the capacitor of the memory cell is preferably 1 fF or more. Similarly, the condition of variations in threshold voltages among transistors forming an inverter is released.

Embodiment 9

In this embodiment, a method for driving the semiconductor memory device illustrated in FIG. 17C is described. In the circuit illustrated in FIG. 17C, the writing transistors WTr_n_m and WTr_n+1_m are omitted from the circuit illustrated in FIG. 17B. The degree of integration can be increased by the decrease of the number of transistors.

For the memory blocks MB used in the semiconductor memory device in FIG. 17C, any memory block illustrated in FIG. 5A, 5B, 6A, or 6B may be used. In the case where the circuit illustrated in FIG. 17C is used, a precharge transistor is not necessarily provided. This is because the reading transistor RTr_n_m is used to precharge the memory block MB_n_m.

Note that also in the driving method in this embodiment, although the potential difference between sub bit lines is amplified by a flip-flop circuit as in Embodiment 8, an error due to noise can be recued because the amplification is performed while one of the sub bit lines is connected to a bit line. The capacitance of a capacitor may be 1 fF or more.

Figure 22:
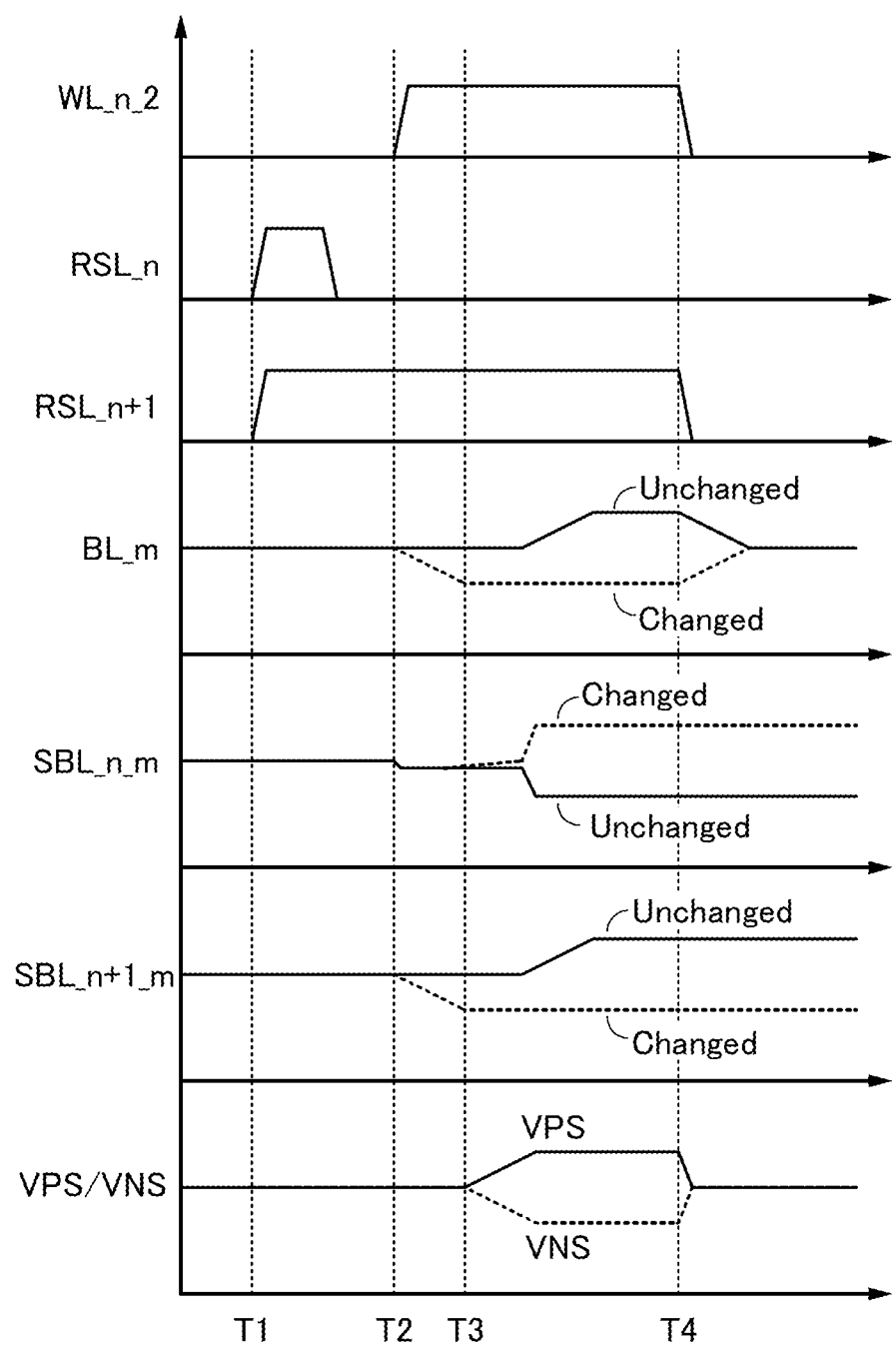
FIG. 22 is a diagram illustrating an example of a method for driving a semiconductor memory device of the present invention.

Hereinafter, the driving method of this embodiment is described with reference to FIG. 22. Here, an example of reading and restoring, or rewriting one bit of data of the memory cell MC_n_m_2 is described. In FIG. 22, the solid line (unchanged) represents the process of data reading and restoring, and the dashed line (changed) represents the process of rewriting. First, the case of reading and restoring one bit of data is described.

⟨1. Precharge⟩

First, in order to precharge the sub bit lines SBL_n_m and SBL_n+1_m to +0.5 V that is a reference potential, the potential of the bit line BL_m is set to +0.5 V, and the reading selection lines RSL_n and RSL_n+1 are activated so that the reading transistors RTr_n_m and RTr_n+1_m are turned on (T1 in FIG. 22).

At that time, the potential of a power VPS of a p-channel transistor of the inverters INV_n_m and INV_n+1_m and the potential of a power VNS of an n-channel transistor are both +0.5 V. Thus, the inverters INV_n_m and INV_n+1_m are not active.

⟨2. Discharge of Capacitor of Memory Cell⟩

Next, the reading transistors RTr_n_m is turned off, so that the sub bit line SBL_n_m is in a floating state. Also, although not illustrated, the bit line BL_m is also in a floating state. Further, since the reading transistor RTr_n+1_m is turned on, the sub bit line SBL_n+1_m is connected to the bit line BL_m. Thus, the sub bit line SBL_n+1_m is also in a floating state.

Further, the word line WL_n_2 is activated, and the transistor of the memory cell MC_n_m_2 is turned on (T2 in FIG. 22). Here, the potential of the sub bit line SBL_n_m is +0.4 V. On the other hand, the potential of the sub bit line SBL_n+1_m (and the bit line BL_m) remains at +0.5 V. The capacitance of the sub bit line SBL_n_m is sufficiently low; thus, time taken until the potential is stabilized is very short.

⟨3. Amplification⟩

After that the potential of the power VPS of the inverters INV_n_m and INV_n+1_m is raised to 1V, and the potential of the power VNS is reduced to 0 V, so that the inverters INV_n_m and INV_n+1_m are activated (T3 in FIG. 22). Accordingly, a flip-flop circuit is formed, and the potential difference between the sub bit lines SBL_n_m and SBL_n+1_m is amplified. Here, the potential of the sub bit line SBL_n+1_m (and the bit line BL_m) becomes +1 V and the potential of the sub bit line SBL_n_m becomes 0 V.

At that time, the rate of change in the potential of the power VPS and the potential of the power VNS depends on the potential difference (here, 0.1V) between the sub bit line SBL_n_m and the sub bit line SBL_n+1_m in the previous state. In order to avoid an error in amplification, it is desirable that the rate of change be lower when the potential difference between the sub bit line SBL_n_m and the sub bit line SBL_n+1_m is smaller; however, the rate of change may be high when the difference between the sub bit line SBL_n_m and the sub bit line SBL_n+1_m is large.

Amplification is completed in a shorter time as the rate of change is higher; thus, the potential difference is preferably large. Further, if the potential difference is large, an error hardly occurs even in the case where variations in the threshold voltages among transistors forming an inverter are large.

In order to increase the potential difference, it is desirable that the number of memory cells connected to a sub bit line be reduced as much as possible and the capacitance of the sub bit line be reduced but the capacitance of a capacitor of a memory cell be relatively increased. However, in the semiconductor memory device of this embodiment, an error tends to occur at the time of amplification as the capacitance of the capacitor is low; thus, the capacitance of the capacitor cannot be too low.

For example, the capacitance of the capacitor is preferably 10 fF to 30 fF. Further, the capacitance of the sub bit line is preferably greater than or equal to 30 fF and less than or equal to 150 fF, and is more preferably less than five times the capacitance of the capacitor.

⟨4. Data Reading and Data Restoring⟩

As described above, the potential of the bit line BL_m is +1 V. By reading the potential of the bit line BL_m, reading of the bit of data is completed. At that time, the transistor of the memory cell MC_n_m_2 is turned on, so that the potential difference between electrodes of the capacitor of the memory cell MC_n_m_2 corresponds to the written data. Thus, the data is restored at the same time.

⟨5. Data Holding⟩

After that, the word line WL_n_2 is inactivated and the transistor of the memory cell memory cell MC_n_m_2 is turned off, whereby the bit of data is held. Further, the inverters INV_n_m and INV_n+1_m are inactivated (T4 in FIG. 22). Note that the reading transistor RTr_n+1_m may be kept on depending on an address of a memory cell to be read out next.

Next, rewriting of data is described.

⟨6. Precharge⟩

As in the case of the data reading, the sub bit lines SBL_n_m and SBL_n+1_m are precharged to +0.5 V (T1 in FIG. 22).

⟨7. Potential Change of Bit Line⟩

Next, the word line WL_n_2 is activated and the transistor of the memory cell memory cell MC_n_m_2 is turned on (T2 in FIG. 22). Almost at the same time, the potential of the bit line BL_m is set to a potential corresponding to data to be written (here, 0 V). Because the reading transistor RTr_n+1_m is on, the potential of the sub bit line SBL_n+1_m changes in a manner similar to that of the bit line BL_m.

⟨Amplification⟩

After that, the inverters INV_n_m and INV_n+1_m are activated (T3 in FIG. 22). Accordingly, a flip-flop circuit is formed, and the potential difference between the sub bit lines SBL_n_m and SBL_n+1_m is amplified. Here, the potential of the sub bit line SBL_n+1_m (and the bit line BL_m) remains at 0 V, and the potential of the sub bit line SBL_n_m is changed from +0.5 V to 1 V.

⟨Data Rewriting⟩

As described above, the potential of the sub bit line SBL_n_m becomes +1 V, and the potential of the bit line BL_m is 0 V. At that time, since the transistor of the memory cell MC_n_m_2 is on, the potential difference between electrodes of the capacitor of the memory cell MC_n_m_2 corresponds to the data to be written.

⟨10. Data Holding⟩

After that, the word line WL_n_2 is inactivated and the transistor of the memory cell MC_n_m_2 is turned off. Accordingly the bit of data is held. Further, the inverters INV_n_m and INV_n+1_m are inactivated (T4 in FIG. 22). Note that the reading transistor RTr_n+1_m may be kept on depending on an address of the memory cell to be read out next.

In the above example, the absolute value of the potential difference between electrodes of the capacitor of the memory cell MC is 1 V. Note that in writing the bit of data, the inverters INV_n_m and INV_n+1_m are not necessarily activated. The period from T7 to T8 can be omitted; thus, time required for writing data can be shortened. However, in that case, the absolute value of the potential difference between electrodes of the capacitor of the memory cell MC is 0.5 V This application is based on Japanese Patent Application serial no. 2011-245512 filed with Japan Patent Office on Nov. 9, 2011, the entire contents of which are hereby incorporated by reference.

What is claimed is:

1. A semiconductor memory device comprising:
   a bit line;
   four or more word lines;
   a first memory block and a second memory block, each comprising a sub bit line, a precharge transistor, and a plurality of memory cells; and
   an amplifier circuit connected to the bit line through a drain and a source of a reading transistor and to the sub bit lines of the first memory block and the second memory block,
   wherein the plurality of memory cells each comprises a transistor and a capacitor,
   wherein a drain of the transistor in the first memory block is connected to one of the sub bit line of the first memory block and the bit line,
   wherein an electrode of the capacitor in the first memory block is connected to the other of the sub bit line of the first memory block and the bit line,
   wherein a drain of the transistor in the second memory block is connected to one of the sub bit line of the second memory block and the bit line,
   wherein an electrode of the capacitor in the second memory block is connected to the other of the sub bit line of the second memory block and the bit line,
   wherein a source of the precharge transistor in the first memory block is connected to the sub bit line of the first memory block, and
   wherein a source of the precharge transistor in the second memory block is connected to the sub bit line of the second memory block.

2. The semiconductor memory device according to claim 1, wherein the amplifier circuit comprises one of an n-channel transistor, a p-channel transistor, a complementary inverter, a resistive load inverter, and a flip-flop circuit.

3. The semiconductor memory device according to claim 1, wherein the precharge transistor and each the transistor in the plurality of memory cells are provided in different layers.

4. The semiconductor memory device according to claim 1, wherein the precharge transistor, the reading transistor, and a transistor in the amplifier circuit comprise silicon.

5. The semiconductor memory device according to claim 1, wherein the transistor in each memory cell comprises an oxide semiconductor.

6. The semiconductor memory device according to claim 1, wherein a depth or a height of the capacitor is 0.3 μm or less.

7. The semiconductor memory device according to claim 1, wherein a capacitance of the capacitor is one femtofarad or less.

8. The semiconductor memory device according to claim 1, wherein a drain of the precharge transistor is connected to the bit line.

9. A semiconductor memory device comprising:
   a bit line;
   four or more word lines;
   a first memory block and a second memory block, each comprising a sub bit line and a plurality of memory cells; and
   an amplifier circuit connected to the bit line through a drain and a source of a reading transistor and to the sub bit lines of the first memory block and the second memory block,
   wherein the plurality of memory cells each comprises a transistor and a capacitor,
   wherein a drain of the transistor in the first memory block is connected to one of the sub bit line of the first memory block and the bit line,
   wherein an electrode of the capacitor in the first memory block is connected to the other of the sub bit line of the first memory block and the bit line,
   wherein a drain of the transistor in the second memory block is connected to one of the sub bit line of the second memory block and the bit line, and
   wherein an electrode of the capacitor in the second memory block is connected to the other of the sub bit line of the second memory block and the bit line.

10. The semiconductor memory device according to claim 9, wherein the amplifier circuit comprises one of an n-channel transistor, a p-channel transistor, a complementary inverter, a resistive load inverter, and a flip-flop circuit.

11. The semiconductor memory device according to claim 9, wherein each the transistor in the plurality of memory cells is provided in different layers.

12. The semiconductor memory device according to claim 9, wherein the reading transistor and a transistor in the amplifier circuit comprise silicon.

13. The semiconductor memory device according to claim 9, wherein the transistor in the plurality of memory cells comprises an oxide semiconductor.

14. The semiconductor memory device according to claim 9, wherein a depth or a height of the capacitor is 0.3 μm or less.

15. The semiconductor memory device according to claim 9, wherein a capacitance of the capacitor is one femtofarad or less.

16. The semiconductor memory device according to claim 1,
   wherein a potential of the sub bit line is configured to be input to the amplifier circuit, and
   wherein the amplifier circuit is configured to output a signal to the bit line through the drain and the source of the reading transistor.

17. The semiconductor memory device according to claim 9,
    wherein a potential of the sub bit line is configured to be input to the amplifier circuit, and
    wherein the amplifier circuit is configured to output a signal to the bit line through the drain and the source of the reading transistor.

* * * * *